(12) United States Patent
Colinge et al.

(10) Patent No.: US 11,038,052 B2
(45) Date of Patent: *Jun. 15, 2021

(54) SEMICONDUCTOR ARRANGEMENT WITH ONE OR MORE SEMICONDUCTOR COLUMNS

(71) Applicant: TAIWAN SEMICONDUCTOR MANUFACTURING COMPANY LIMITED, Hsin-Chu (TW)

(72) Inventors: Jean-Pierre Colinge, Hsinchu (TW); Kuo-Cheng Ching, Zhubei (TW); Ta-Pen Guo, Taipei (TW); Carlos H. Diaz, Mountain View, CA (US)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 16 days.

This patent is subject to a terminal disclaimer.

(21) Appl. No.: 16/410,126

(22) Filed: May 13, 2019

(65) Prior Publication Data

US 2019/0267488 A1 Aug. 29, 2019

Related U.S. Application Data

(60) Continuation of application No. 15/983,444, filed on May 18, 2018, now Pat. No. 10,290,737, which is a
(Continued)

(51) Int. Cl.
*H01L 21/308* (2006.01)
*H01L 29/78* (2006.01)
(Continued)

(52) U.S. Cl.
CPC .......... *H01L 29/7827* (2013.01); *B82Y 10/00* (2013.01); *B82Y 40/00* (2013.01);
(Continued)

(58) Field of Classification Search
CPC .......... H01L 29/66666; H01L 29/7827; H01L 29/7828; H01L 21/0332; H01L 21/3081;
(Continued)

(56) References Cited

U.S. PATENT DOCUMENTS 10,290,737 B2 * 5/2019 Colinge .............. H01L 29/7827
2007/0284623 A1 12/2007 Kim et al.
(Continued)

FOREIGN PATENT DOCUMENTS

| CN | 102259832 A | 11/2011 |
| KR | 100712552 B2 | 5/2007 |
| KR | 100771871 | 11/2007 |

OTHER PUBLICATIONS

Sakui, et al., "A New Vertical MOSFET 'Vertical Logic Circuit (VLC) MOSFET' Suppressing Asymmetric Characteristics and realizing an Ultra Compact and Robust Logic Circuit", Solid-State Electronics 54 (2010) 1457-1462, www.elsevier.com/locate/sse.
(Continued)

*Primary Examiner* — Eric A. Ward
(74) *Attorney, Agent, or Firm* — Cooper Legal Group, LLC

(57) ABSTRACT

A semiconductor arrangement comprises a substrate region and a first semiconductor column projecting from the substrate region. The semiconductor arrangement comprises a second semiconductor column projecting from the substrate region. The second semiconductor column is separated a first distance from the first semiconductor column. The first distance is between about 10 nm to about 30 nm.

20 Claims, 25 Drawing Sheets

Related U.S. Application Data division of application No. 13/969,114, filed on Aug. 16, 2013, now Pat. No. 9,978,863.

(51) Int. Cl.
*H01L 29/06* (2006.01)
*H01L 29/423* (2006.01)
*H01L 29/66* (2006.01)
*B82Y 10/00* (2011.01)
*B82Y 40/00* (2011.01)
*H01L 29/775* (2006.01)
*H01L 21/3213* (2006.01)

(52) U.S. Cl.
CPC ...... *H01L 21/3086* (2013.01); *H01L 29/0657* (2013.01); *H01L 29/0676* (2013.01); *H01L 29/42392* (2013.01); *H01L 29/66439* (2013.01); *H01L 29/66666* (2013.01); *H01L 29/775* (2013.01); *H01L 21/32139* (2013.01)

(58) Field of Classification Search
CPC ........... H01L 29/42392; H01L 29/0676; H01L 29/78642; H01L 29/66439; H01L 29/775; H01L 21/027–0338; H01L 21/0338; H01L 21/3088; B82Y 10/00; B82Y 40/10
See application file for complete search history.

(56) References Cited

U.S. PATENT DOCUMENTS

| | | | |
|---|---|---|---|
| 2008/0241574 A1* | 10/2008 | Maszara | H01L 21/0337 |
| | | | 428/620 |
| 2010/0047720 A1* | 2/2010 | Yoshino | H01L 21/0338 |
| | | | 430/312 |
| 2010/0187658 A1 | 7/2010 | Wei | |
| 2011/0294295 A1 | 12/2011 | Zhu et al. | |
| 2012/0040528 A1 | 2/2012 | Kim et al. | |
| 2014/0024215 A1 | 1/2014 | Cheng et al. | |
| 2014/0225184 A1 | 8/2014 | Colinge et al. | |
| 2014/0332859 A1 | 11/2014 | Colinge et al. | |

OTHER PUBLICATIONS

Baek, et al., "Characteristics of Gate-All-Around Silicon Nanowire Field Effect Transistors with Asymmetric Channel Width and Source/Drain Doping Concentration", 23 pgs, Aug. 13, 2012, http://jap.aip.org/resource/1/japiau/v112/i3/p034513_s1?isAuthorized=no.

Jin, et al., "A Three-Dimensional Simulation of Quantum Transport in Silicon Nanowire Transistor in the Presence of Electron-Phonon Interactions", Published by the American Institute of Physics, 2006, 11 pgs, http://dx.dio.org/10.1063/1.2206885.

Sato, et al., "Electrical Characteristics of Asymmetrical Silicon Nanowire Field-Effect Transistors", Published by American Institute of Physics, Dec. 2, 2011, 4 pgs, http://dx.dio.org/10.1063/1.3665261.

Venugopalan, et al., "Modeling Intrinsic and Extrinsic Asymmetry of 3D Cylindrical Gate/Gate-All-Around FETs for Circuit Simulations", Department of Electrical Engineering and Computer Sciences, University of California, Berkeley 2011, 4 pgs. http://www.eecs.berkeley.edu/~yogesh/PapersNVMTS_Sriram.pdf.

* cited by examiner

SEMICONDUCTOR ARRANGEMENT WITH ONE OR MORE SEMICONDUCTOR COLUMNS

RELATED APPLICATION

This application is a continuation of and claims priority to U.S. patent application Ser. No. 15/983,444, titled "SEMICONDUCTOR ARRANGEMENT WITH ONE OR MORE SEMICONDUCTOR COLUMNS" and filed on May 18, 2018, which is a divisional of and claims priority to Ser. No. 13/969,114, titled "SEMICONDUCTOR ARRANGEMENT WITH ONE OR MORE SEMICONDUCTOR COLUMNS" and filed on Aug. 16, 2013. U.S. patent application Ser. Nos. 15/983,444 and 13/969,114 are incorporated herein by reference.

BACKGROUND

In a vertical transistor, a vertical column is formed over a substrate. A gate electrode is formed to encircle the vertical column, with the encircled portion of the vertical column forming the channel of the vertical transistor. The vertical column may be a vertical nano-wire formed of a semiconductor material.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for forming a semiconductor arrangement are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
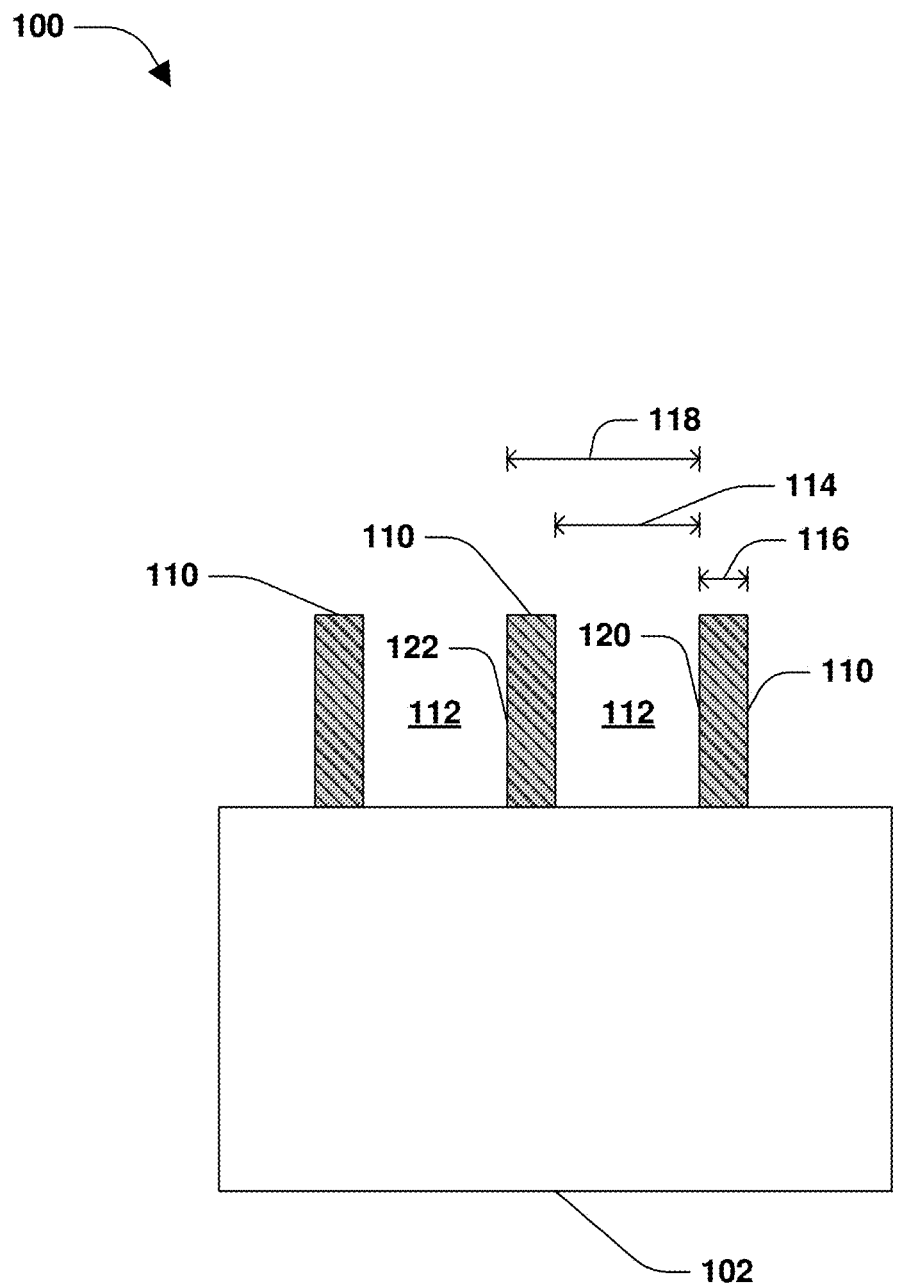
FIG. 1 illustrates a portion of a semiconductor arrangement, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor arrangement and resulting structures formed thereby are provided herein.

FIG. 1 is a sectional view illustrating a portion of a semiconductor arrangement 100 according to some embodiments. In an embodiment, the semiconductor arrangement 100 comprises a substrate region 102. The substrate region 102 comprises any number of materials, such as, for example, silicon, polysilicon, germanium, etc., alone or in combination. According to some embodiments, the substrate region 102 comprises an epitaxial layer, a silicon-on-insulator (SOI) structure, etc. According to some embodiments, the substrate region 102 corresponds to a wafer or a die formed from a wafer.

According to some embodiments, the semiconductor arrangement 100 includes a first mask material 110. In an embodiment, the first mask material 110 is formed over the substrate region 102. The first mask material 110 comprises any number of materials, such as, for example, oxides, silicon dioxide ($SiO_2$), etc. According to some embodiments, the first mask material 110 is formed by deposition, epitaxial growth, thermal growth, etc.

According to some embodiments, the first mask material 110 is patterned to form one or more first openings 112. In some embodiments, the first openings 112 comprise a distance 114 between adjacent portions of the first mask material 110. In some embodiments, the distance 114 is about 20 nanometers (nm) to about 40 nm. In an embodiment, the distance 114 is about 30 nm. In some embodiments, the first mask material 110 comprises a thickness 116 of about 5 nm to about 15 nm. In an embodiment, the thickness 116 is about 10 nm. In some embodiments, a pitch distance 118 comprises a distance separating an end 120 of the first mask material 110 to an end 122 of an adjacent first mask material 110. According to some embodiments, the pitch distance 118 is about 25 nm to about 55 nm. In an embodiment, the pitch distance 118 is about 40 nm.

Figure 2:
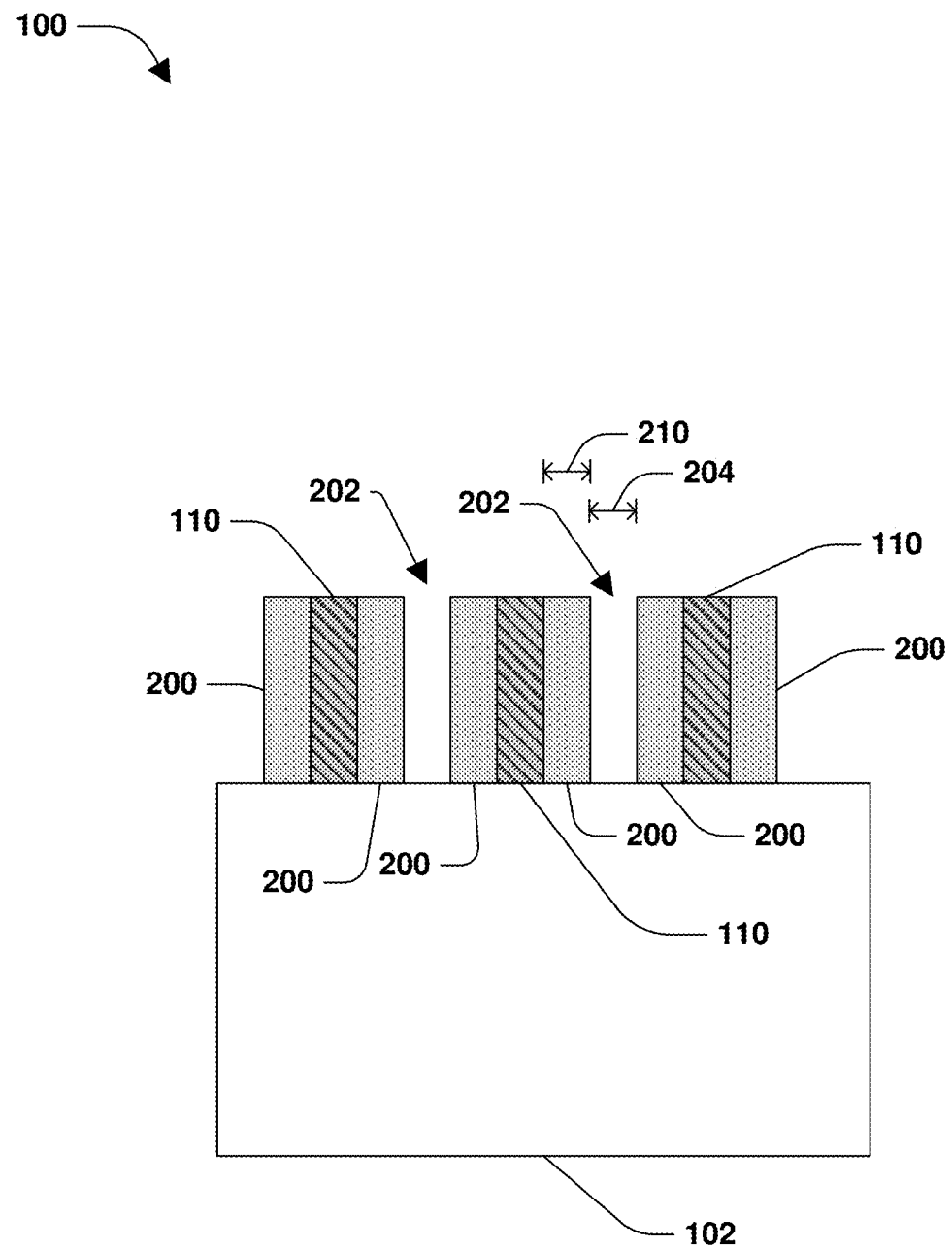
FIG. 2 illustrates a portion of a semiconductor arrangement, according to an embodiment.

Turning to FIG. 2, in an embodiment, a second mask material 200 is formed. In an embodiment, the second mask material 200 is formed over the substrate region 102. The second mask material 200 comprises any number of materials, such as, for example, nitrides, $Si_3N_3$, etc. In some embodiments, the second mask material 200 comprises a different material than the first mask material 110. In an embodiment, the first mask material 110 comprises $SiO_2$ and the second mask material 200 comprises $Si_3N_3$. According to some embodiments, the second mask material 200 is formed by deposition, epitaxial growth, etc.

According to some embodiments, the second mask material 200 is patterned to form one or more second openings 202. In some embodiments, the second openings 202 comprise a distance 204. In some embodiments, the distance 204 is about 5 nm to about 15 nm. In an embodiment, the distance 204 is about 10 nm. In some embodiments, the second mask material 200 comprises a thickness 210 of about 5 nm to about 15 nm. In an embodiment, the thickness 210 is about 10 nm. In some embodiments, the second mask material 200 is patterned so as to be positioned on both sides of the first mask material 110.

Figure 3:
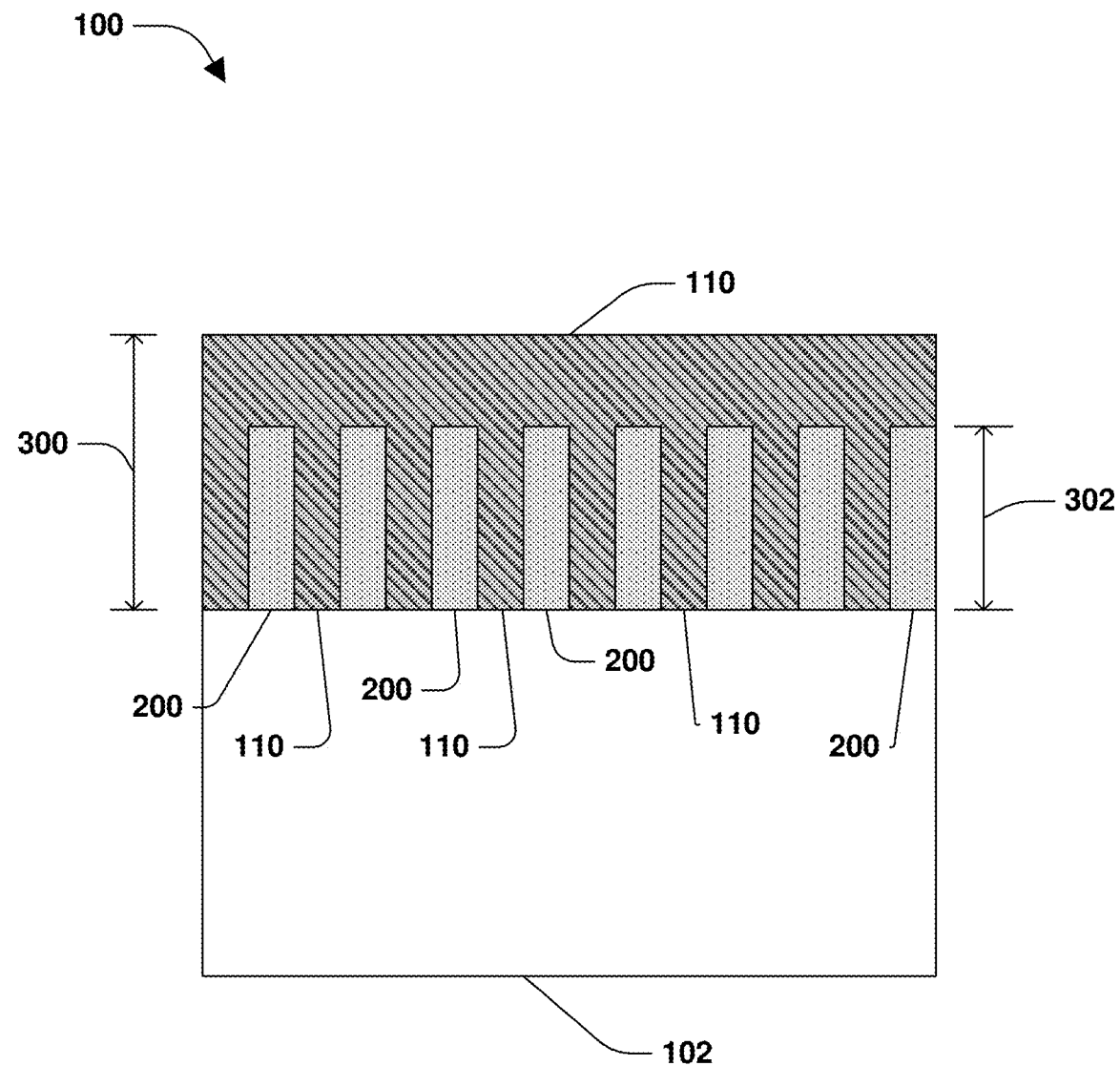
FIG. 3 illustrates a portion of a semiconductor arrangement, according to an embodiment.

Turning now to FIG. 3, in an embodiment, the first mask material 110 is formed over the substrate region 102, the second mask material 200 and existing portions of the first mask material 110 illustrated in FIG. 1 and FIG. 2. In an embodiment, the first mask material 110 is formed within the second openings 202 (illustrated in FIG. 2). In an embodiment, the first mask material 110 includes a height 300 that is larger than a height 302 of the second mask material 200. According to some embodiments, the first mask material 110 is formed by deposition, epitaxial growth, etc.

Figure 4A:
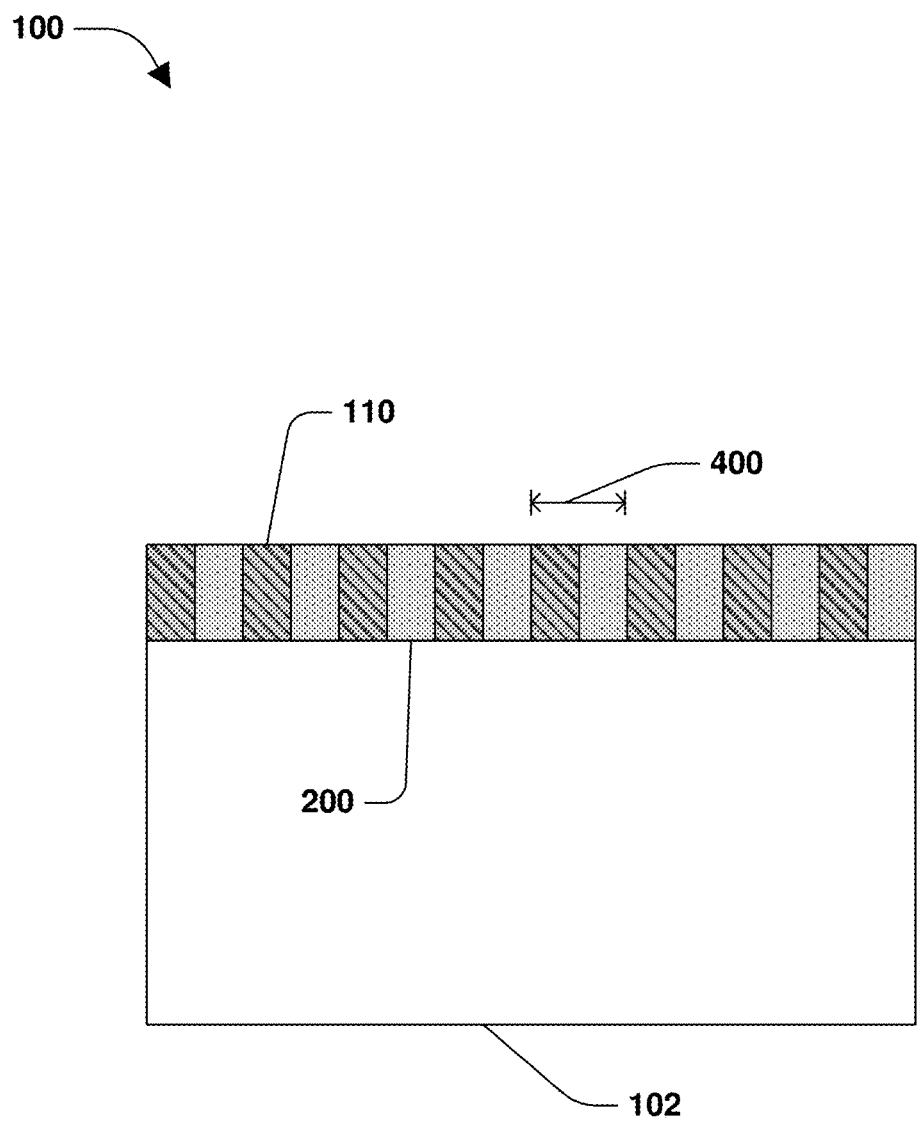
FIG. 4a illustrates forming a first mask region associated with forming a semiconductor arrangement, according to an embodiment.

Turning now to FIG. 4a, in an embodiment, the first mask material 110 and the second mask material 200 are planarized. In some embodiments, the first mask material 110 and the second mask material 200 are planarized by a chemical-mechanical planarization (CMP) process. According to some embodiments, the first mask material 110 and second mask material 200 comprise a pitch distance 400. In an embodiment, the pitch distance 400 comprises a thickness of the first mask material 110 and the second mask material 200. In some embodiments, the pitch distance 400 is about 10 nm to about 30 nm. In an embodiment, the pitch distance 400 is about 20 nm. According to some embodiments, the pitch distance 400 is about one half of the pitch distance 118 illustrated in FIG. 1. Accordingly, a pitch distance between adjacent or neighboring instances of a masking material depicted in FIG. 4a is about one half of that depicted in FIG. 1.

Figure 4B:
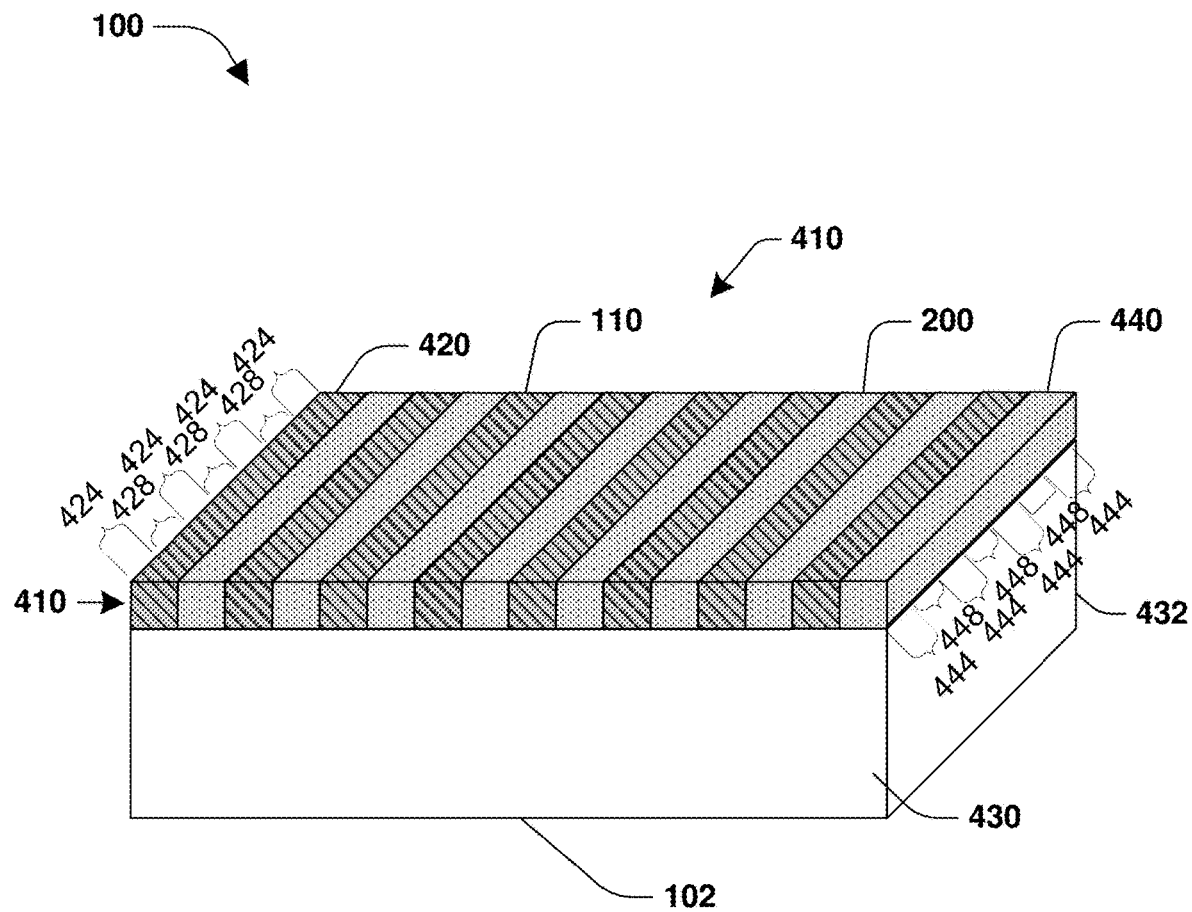
FIG. 4b illustrates forming a first mask region associated with forming a semiconductor arrangement, according to an embodiment.

FIG. 4b is a perspective view of the embodiment illustrated in FIG. 4a, where the first mask material 110 and the second 200 are collectively said to define or comprise a first mask region 410. According to some embodiments, the first mask region 410 is thus said to comprise first mask portions 420, comprised of the first mask material 110 of FIG. 4a, and second mask portions 440, comprised of the second mask material 200 of FIG. 4a. According to some embodiments, at least one of the first mask portions 420 or the second mask portions 440 extend across the substrate region 102 of the semiconductor arrangement 100 between a first end 430 and a second end 432. According to some embodiments, the first mask portions 420 comprise first areas 424 and third areas 428. According to some embodiments, the second mask portions 440 comprise second areas 444 and fourth areas 448.

Figure 5:
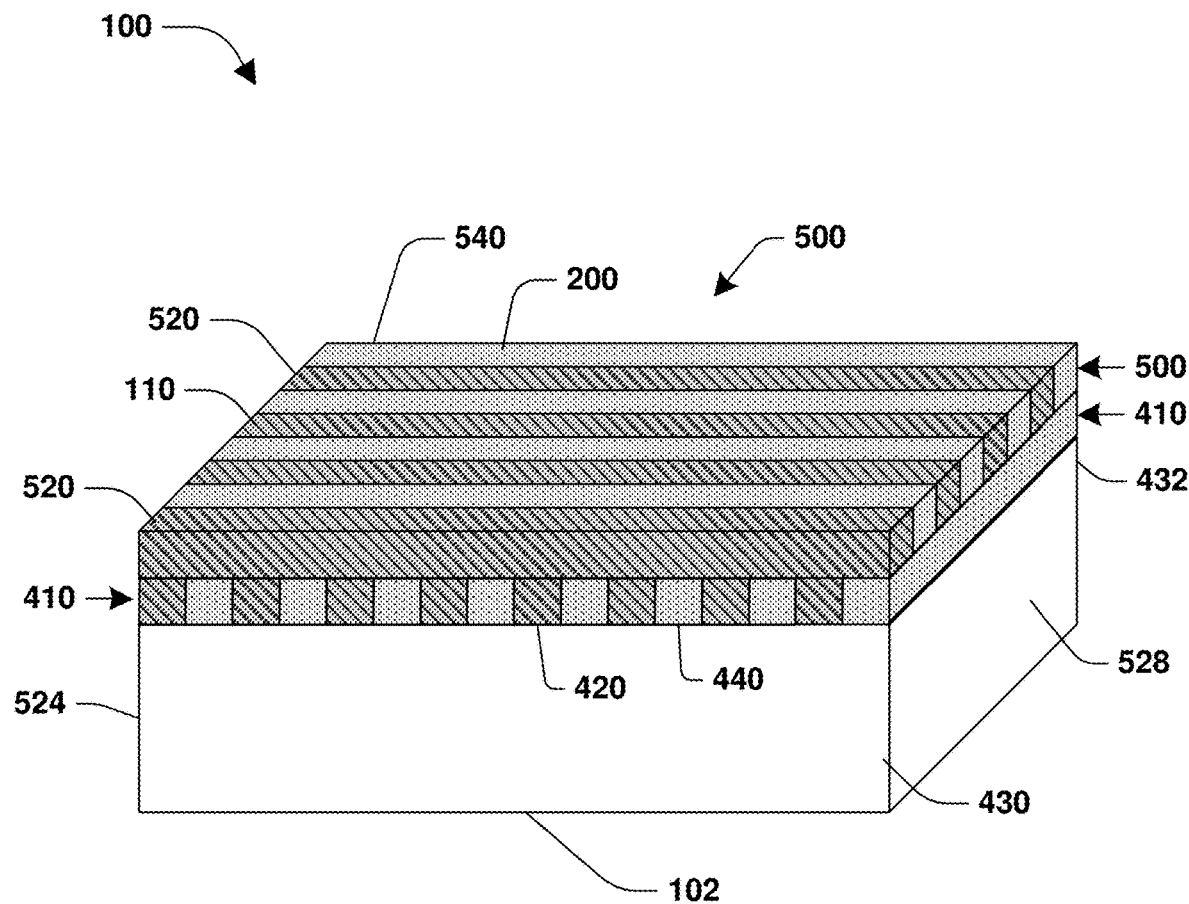
FIG. 5 illustrates forming a second mask region associated with forming a semiconductor arrangement, according to an embodiment.

Turning now to FIG. 5, in an embodiment, a second mask region 500 is formed over the first mask region 410. In some embodiments, the second mask region 500 is formed in a similar manner as the first mask region 410. According to some embodiments, the second mask region 500 comprises third mask portions 520 and fourth mask portions 540. In some embodiments, the third mask portions 520 are comprised of the first mask material 110. In some embodiments, the fourth mask portions 540 are comprised of the second mask material 200. In an embodiment, at least one of the third mask portions 520 or the fourth mask portions 540 extend across the first mask region 410 of the semiconductor arrangement 100 between a third end 524 and a fourth end 528. According to some embodiments, the third mask portions 520 and fourth mask portions 540 extend in a substantially perpendicular direction with respect to the first mask portions 420 and the second mask portions 440.

Figure 6A:
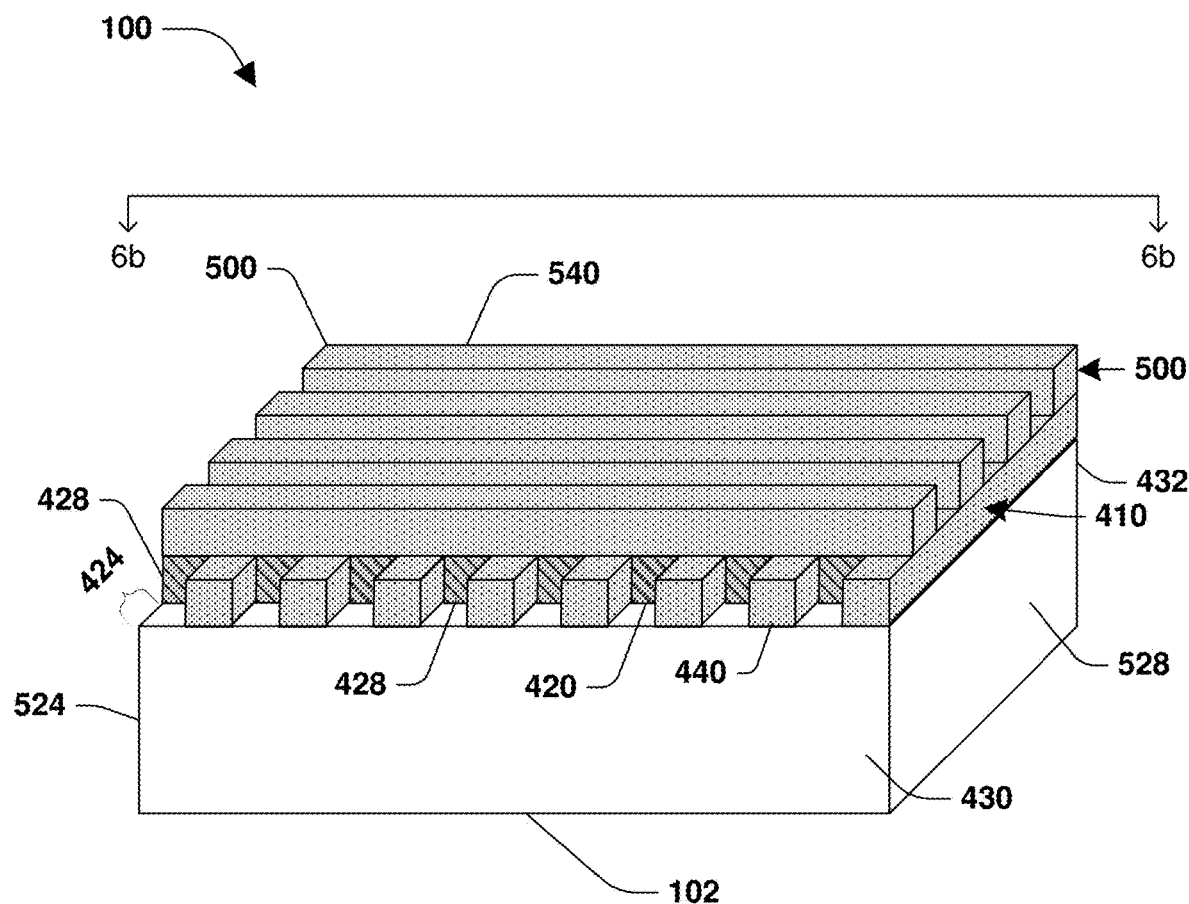
FIG. 6a illustrates patterning a first mask region and a second mask region associated with forming a semiconductor arrangement, according to an embodiment.
Figure 6B:
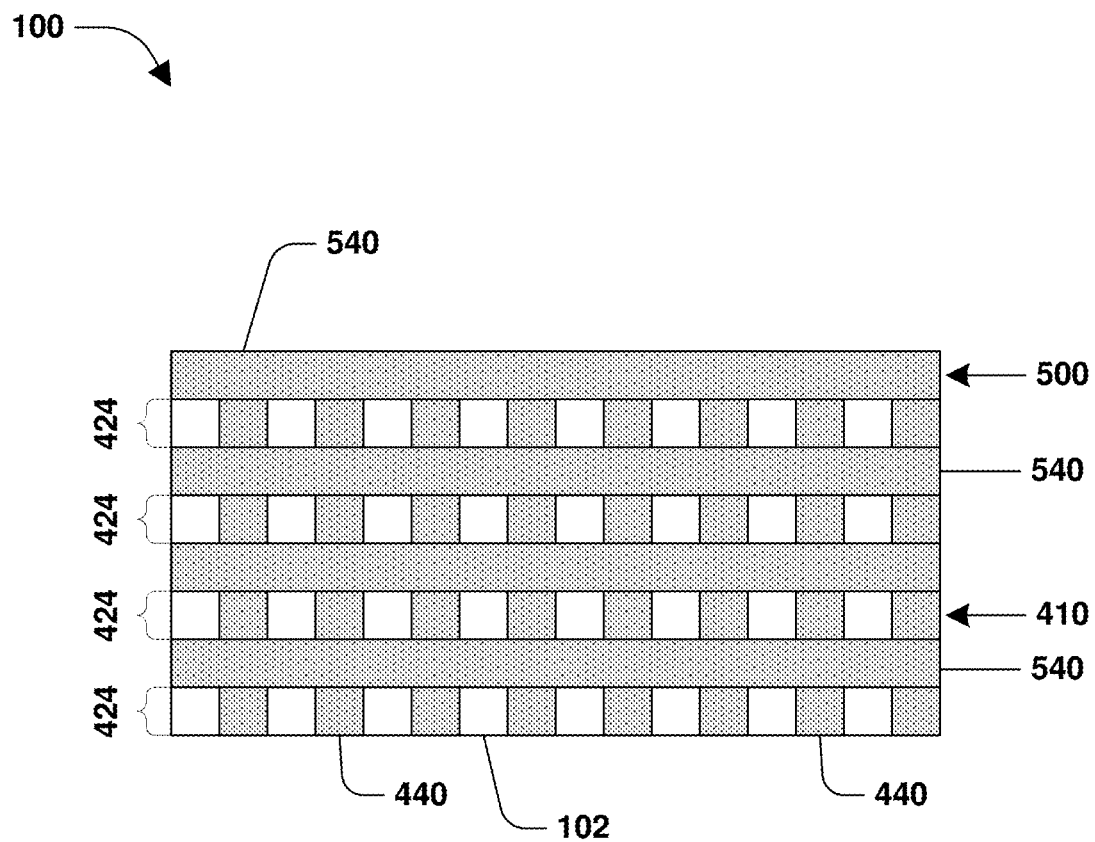
FIG. 6b illustrates patterning a first mask region and a second mask region associated with forming a semiconductor arrangement, according to an embodiment.

Turning now to FIGS. 6a and 6b, in an embodiment, the first mask region 410 and the second mask region 500 are patterned. FIG. 6b is a top down view of the embodiment of FIG. 6a as viewed from a perspective indicated by lines 6b-6b in FIG. 6b. According to some embodiments, the second mask region 500 is patterned by removing the third mask portions 520 and the first mask region 410 is patterned by removing the first areas 424 of the first mask portions 420 under the third mask portions 520. In some embodiments, the third mask portions 520 and the first areas 424 are removed by wet etching, dry etching, etc. According to some embodiments, the etch chemistry for etching through the third mask portions 520 and the first areas 424 includes hydrofluoric acid, $CF_4$, plasma, etc. In some embodiments, the third areas 428 of the first mask portions 420 are located under the fourth mask portions 540 and are not removed.

Figure 7A:
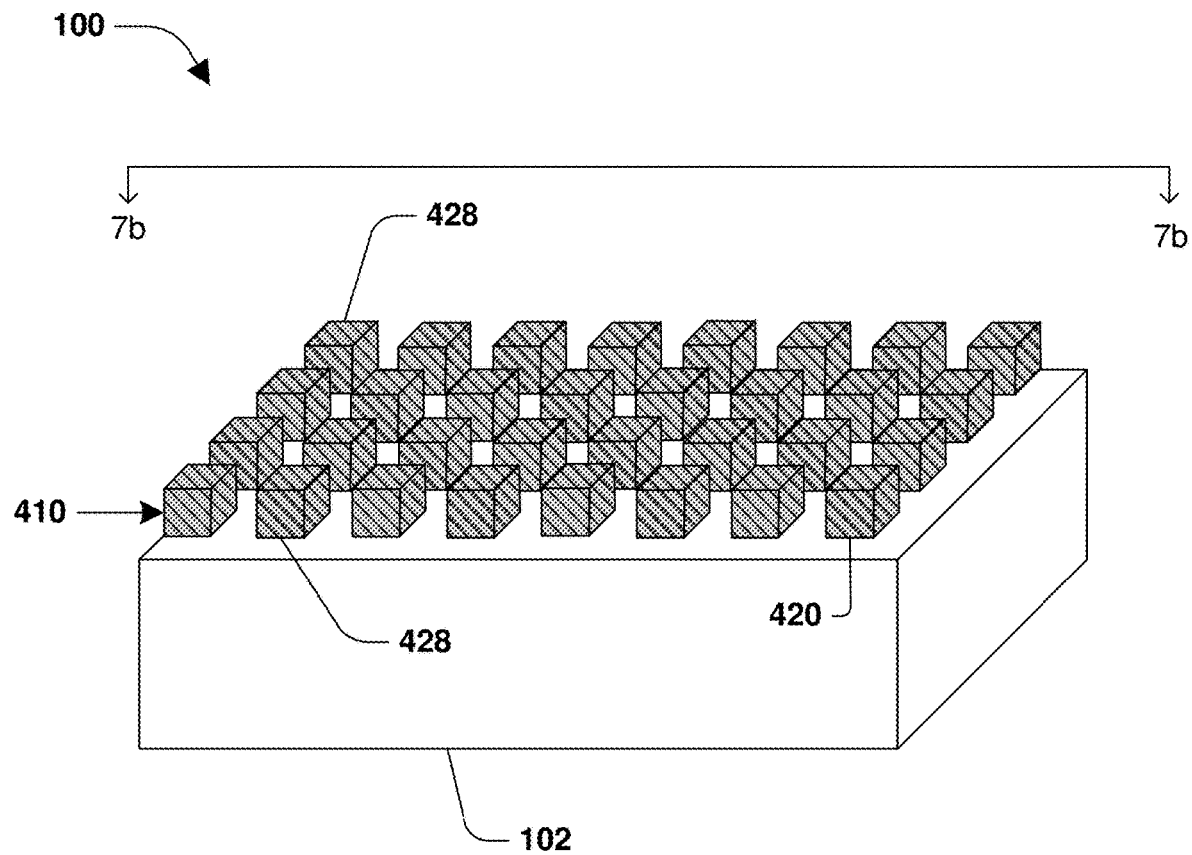
FIG. 7a illustrates a portion of a semiconductor arrangement, according to an embodiment.
Figure 7B:
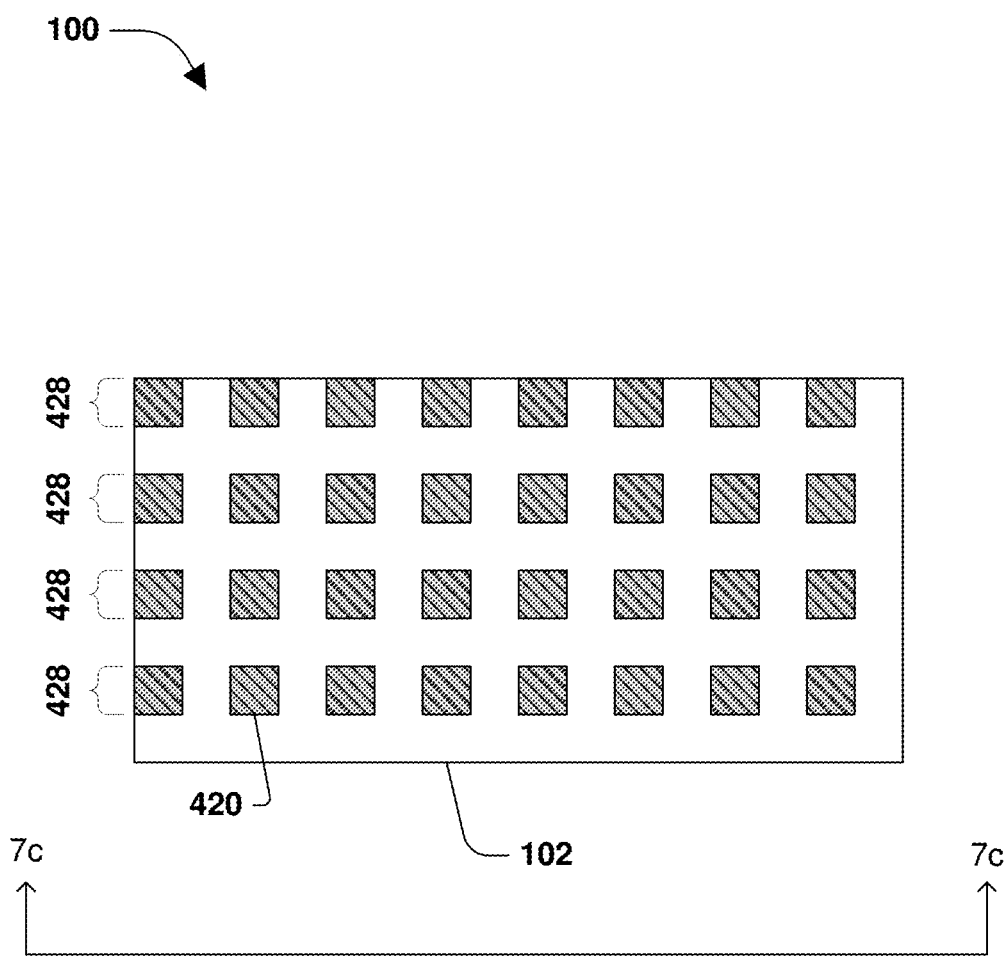
FIG. 7b illustrates a portion of a semiconductor arrangement, according to an embodiment.
Figure 7C:
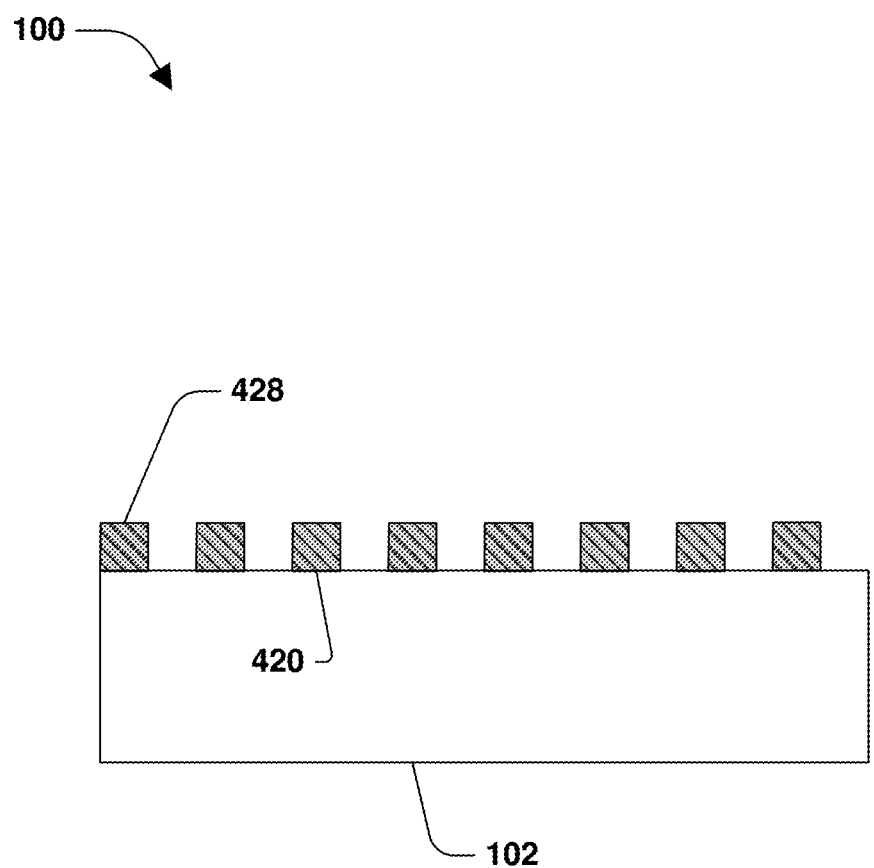
FIG. 7c illustrates a portion of a semiconductor arrangement, according to an embodiment.

Turning now to FIGS. 7a to 7c, in an embodiment, the second mask region 500 is patterned by removing the fourth mask portions 540 and the first mask region 410 is patterned by removing the second mask portions 440. FIG. 7b is a top down view of the embodiment of FIG. 7a as viewed from a perspective indicated by lines 7b-7b in FIG. 7a. FIG. 7c is a side elevation view of the embodiment of FIG. 7b as viewed from a perspective indicated by lines 7c-7c in FIG. 7b. In some embodiments, the fourth mask portions 540 and second mask portions 440 are removed by wet etching, dry etching, etc. According to some embodiments, the etch chemistry for etching through the fourth mask portions 540 and second mask portions 440 includes hot phosphoric acid ($H_3PO_4$), $SF_6$ or $CF_4$ plasma etching, etc. In some embodiments, the third areas 428 of the first mask portions 420 are not removed.

Figure 8:
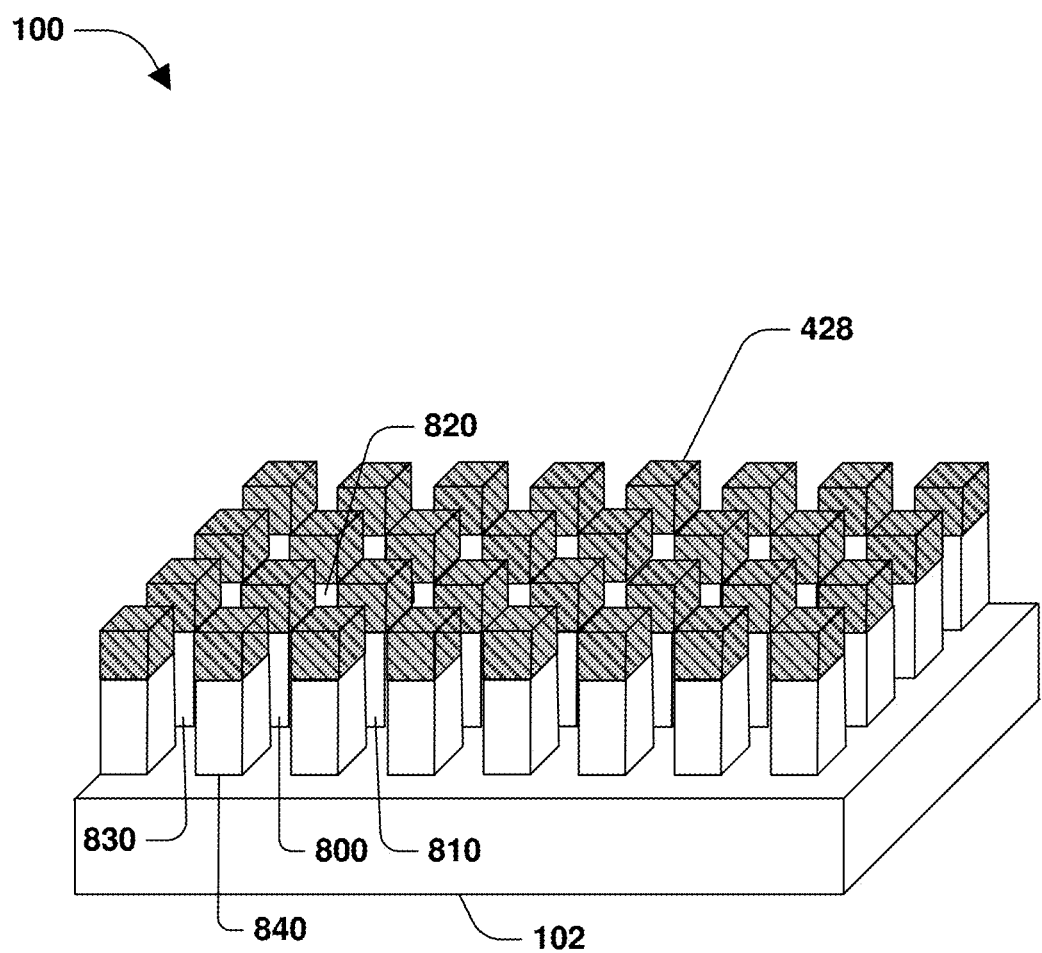
FIG. 8 illustrates forming a first semiconductor column and a second semiconductor column associated with forming a semiconductor arrangement, according to an embodiment.

Turning now to FIG. 8, in an embodiment, one or more semiconductor columns are formed. According to some embodiments, a first semiconductor column 800, second semiconductor column 810, third semiconductor column 820, fourth semiconductor column 830, and fifth semiconductor column 840 are formed from the substrate region 102 under the first mask region 410. In some embodiments, the first semiconductor column 800, second semiconductor column 810, third semiconductor column 820, fourth semiconductor column 830, and fifth semiconductor column 840 are formed under the third areas 428 of the first mask portions 420 of the first mask region 410.

The semiconductor columns 800, 810, 820, 830, 840 as well as zero or more other semiconductor columns not referenced, are formed in any number of ways. In some embodiments, the semiconductor columns 800, 810, 820, 830, 840 as well as zero or more other semiconductor columns not referenced, are formed by etching. In an embodiment, portions of the substrate region 102 that are not covered by the third areas 428 of the first mask portions 420 are removed to form the semiconductor columns 800, 810, 820, 830, 840. According to some embodiments, at least one of the first semiconductor column 800, second semiconductor column 810, third semiconductor column 820, fourth semiconductor column 830, or fifth semiconductor column 840 project from the substrate region 102 and comprise at least one of silicon or polysilicon.

Figure 9:
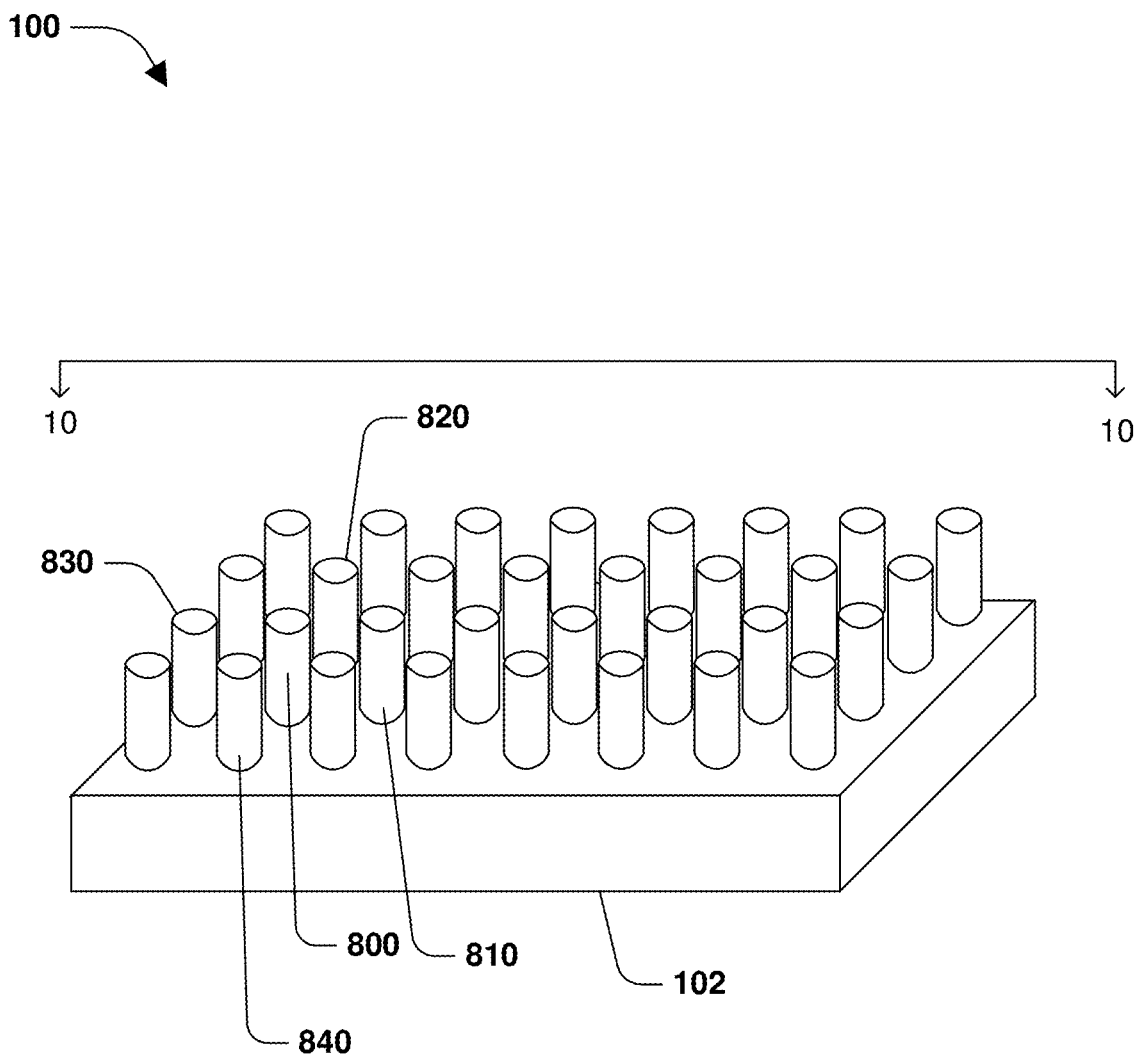
FIG. 9 illustrates forming a first semiconductor column and a second semiconductor column associated with forming a semiconductor arrangement, according to an embodiment.
Figure 10:
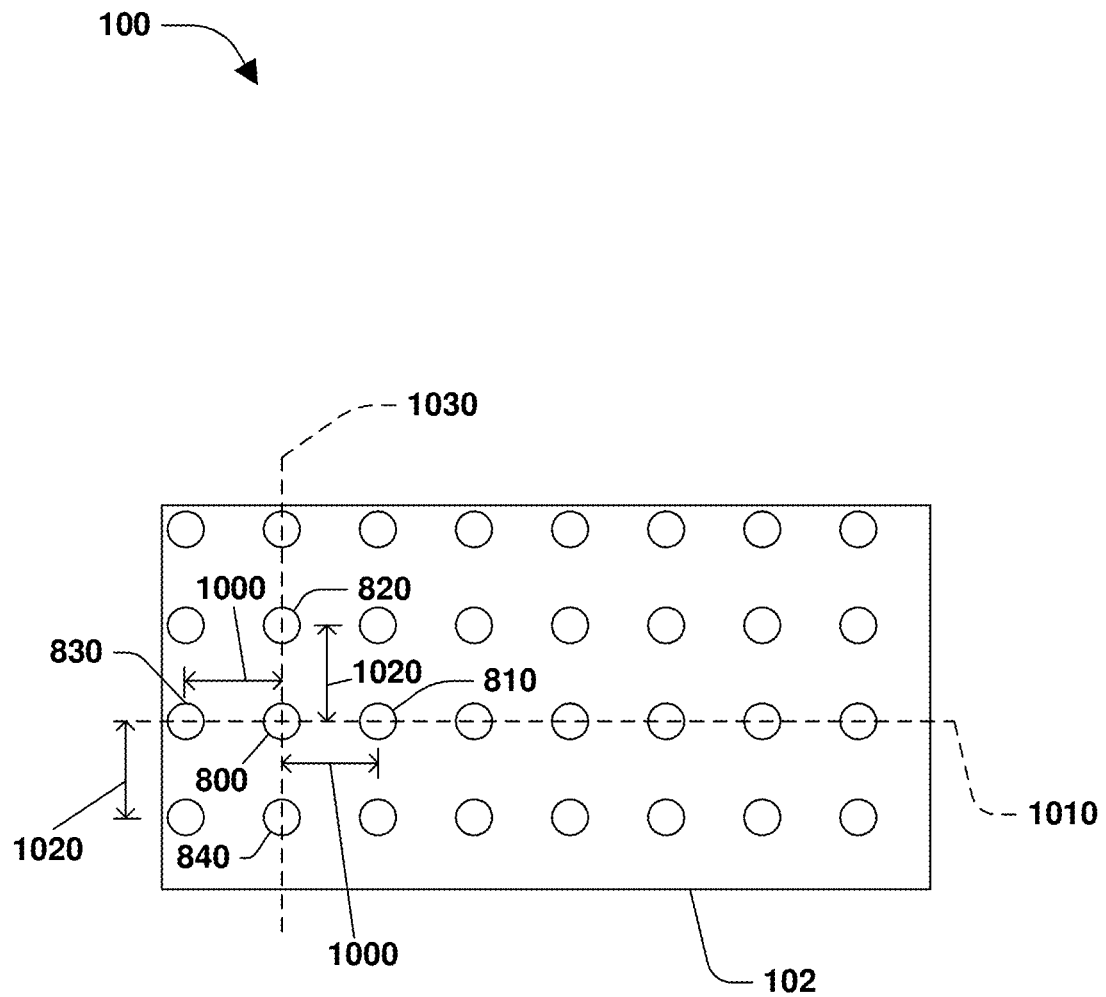
FIG. 10 illustrates forming a first semiconductor column and a second semiconductor column associated with forming a semiconductor arrangement, according to an embodiment.

Turning now to FIGS. 9 and 10, according to some embodiments, the third areas 428 of the first mask portions 420 are removed and the semiconductor columns 800, 810, 820, 830, 840 are patterned. FIG. 10 is a top down view of the embodiment of FIG. 9 as viewed from a perspective indicated by lines 10-10. In an embodiment, the third areas 428 of the first mask portions 420 are removed in any number of ways, such as by etching. In some embodiments, the semiconductor columns 800, 810, 820, 830, 840 as well as zero or more other semiconductor columns not referenced, are patterned, such as by oxidization, annealing, such as in hydrogen ($H_2$), etc. In some embodiments, the semiconductor columns 800, 810, 820, 830, 840 are patterned before the third areas 428 of the first mask portions 420 are removed. In some embodiments, the semiconductor columns 800, 810, 820, 830, 840 are patterned after the third areas 428 of the first mask portions 420 are removed. According to some embodiments, at least one of the semiconductor columns 800, 810, 820, 830, 840, as well as zero or more other semiconductor columns not referenced, are patterned such that a cross-section of the semiconductor columns 800, 810, 820, 830, 840 is substantially circular.

As illustrated in FIG. 10, according to some embodiments, the second semiconductor column 810 is separated a first distance 1000 from the first semiconductor column 800. According to some embodiments, the first distance 1000 is between about 10 nm to about 30 nm. In an embodiment, the first distance 1000 is about 20 nm. According to some embodiments, the second semiconductor column 810 is separated the first distance 1000 from the first semiconductor column 800 along a first axis 1010. According to some embodiments, the fourth semiconductor column 830 is separated the first distance 1000 from the first semiconductor column 800. In some embodiments, the fourth semiconductor column 830 is separated the first distance 1000 from the first semiconductor column 800 along the first axis 1010. According to some embodiments, the first distance 1000 separating the second semiconductor column 810 from the first semiconductor column 800 is different than the first distance 1000 separating the fourth semiconductor column 830 from the first semiconductor column 800.

According to some embodiments, the third semiconductor column 820 is separated a second distance 1020 from the first semiconductor column 800. According to some embodiments, the second distance 1020 is between about 10 nm to about 30 nm. In an embodiment, the second distance 1020 is about 20 nm. According to some embodiments, the third semiconductor column 820 is separated the second distance 1020 from the first semiconductor column 800 along a second axis 1030. In some embodiments, the second axis 1030 is substantially perpendicular to the first axis 1010. According to some embodiments, the fifth semiconductor column 840 is separated the second distance 1020 from the first semiconductor column 800. In some embodiments, the fifth semiconductor column 840 is separated the second distance 1020 from the first semiconductor column 800 along the second axis 1030 that is substantially perpendicular to the first axis 1010. According to some embodiments, the second distance 1020 separating the third semiconductor column 820 from the first semiconductor column 800 is different than the second distance 1020 separating the fifth semiconductor column 840 from the first semiconductor column 800.

Figure 11A:
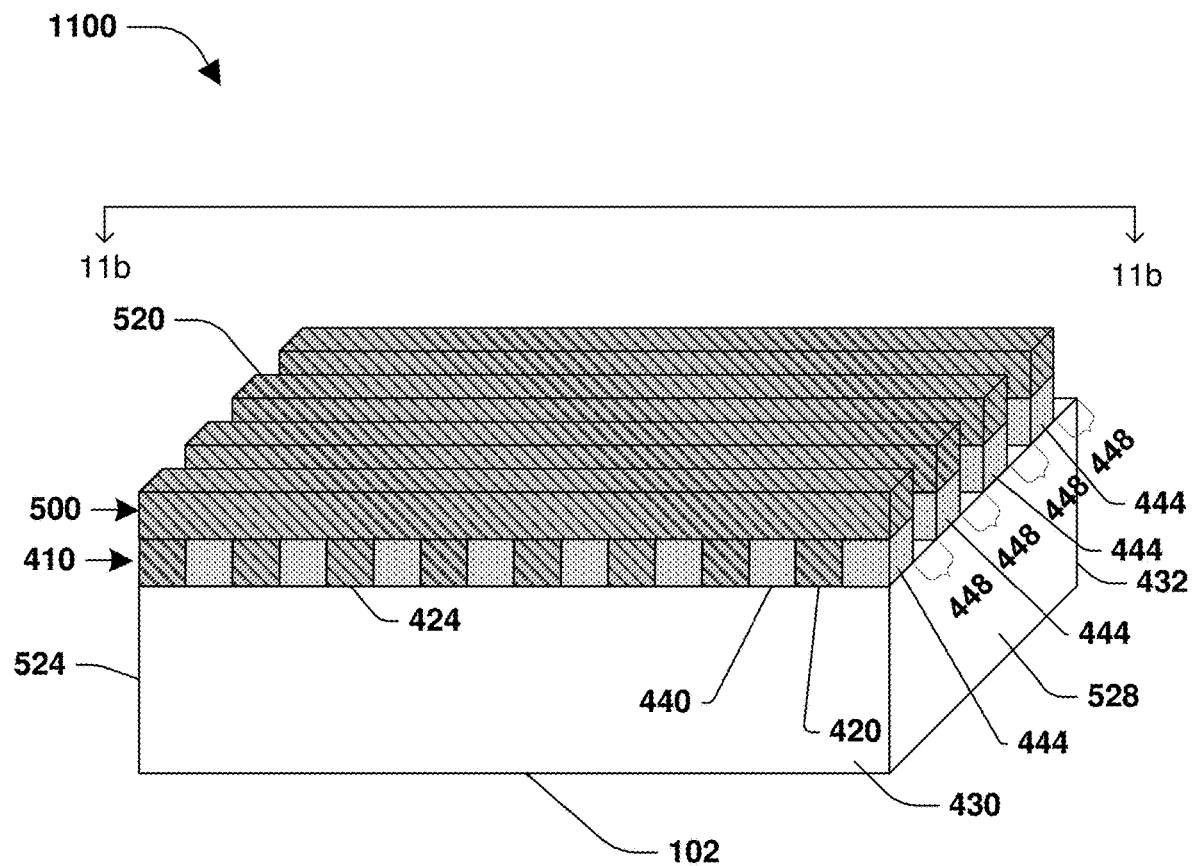
FIG. 11a illustrates patterning a first mask region and a second mask region associated with forming a semiconductor arrangement, according to an embodiment.
Figure 11B:
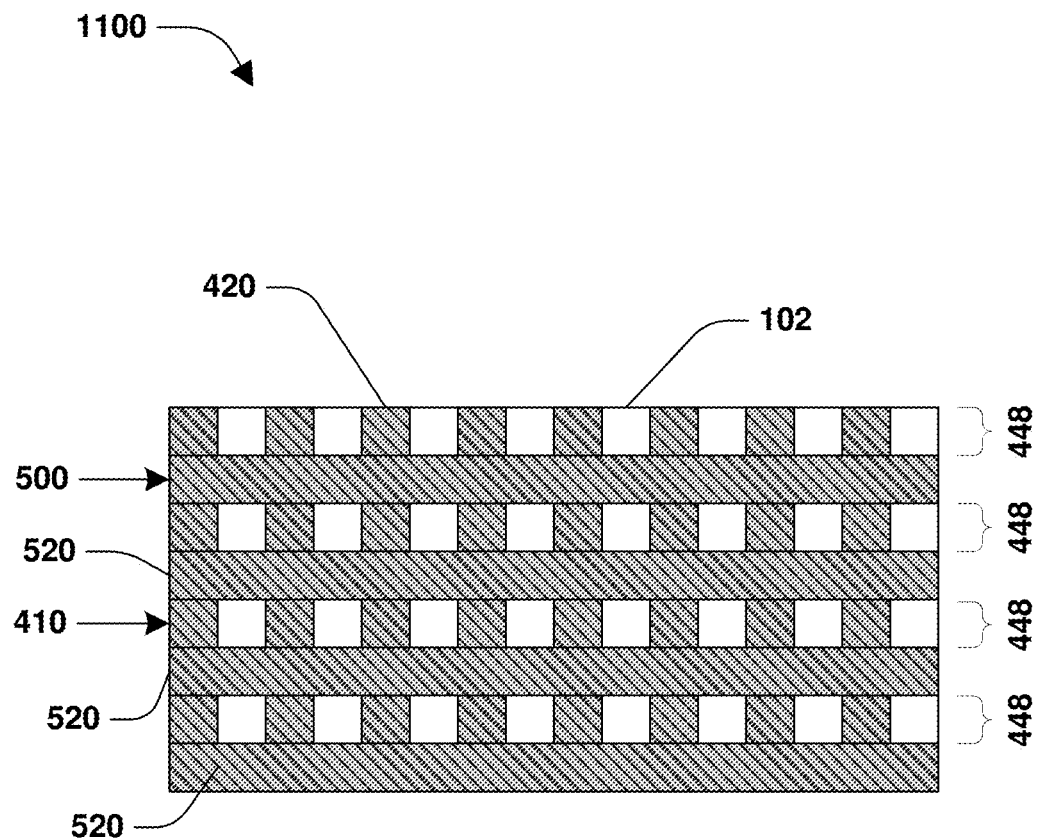
FIG. 11b illustrates patterning a first mask region and a second mask region associated with forming a semiconductor arrangement, according to an embodiment.

FIGS. 11a and 11b illustrate an embodiment of a second semiconductor arrangement 1100 after the first mask region 410 and the second mask region 500 are patterned following the embodiment illustrated in FIG. 5. FIG. 11b is a top down view of the embodiment of FIG. 11a as viewed from a perspective indicated by lines 11b-11b. According to some embodiments, the second semiconductor arrangement 1100 comprises the substrate region 102, the first mask region 410, second mask region 500, etc. According to some embodiments, the second mask region 500 is patterned by removing the fourth mask portions 540 and fourth areas 448 of the second mask portions 440 under the fourth mask portions 540. In some embodiments, the fourth mask portions 540 and fourth areas 448 of the second mask portions 440 are removed by wet etching, dry etching, etc. According to some embodiments, the etch chemistry for etching through the fourth mask portions 540 and fourth areas 448 of the second mask portions 440 includes hot phosphoric acid ($H_3PO_4$), RIE plasma, etc. In some embodiments, the second areas 444 of the second mask portions 440 are located under the third mask portions 520 and are not removed.

Figure 12A:
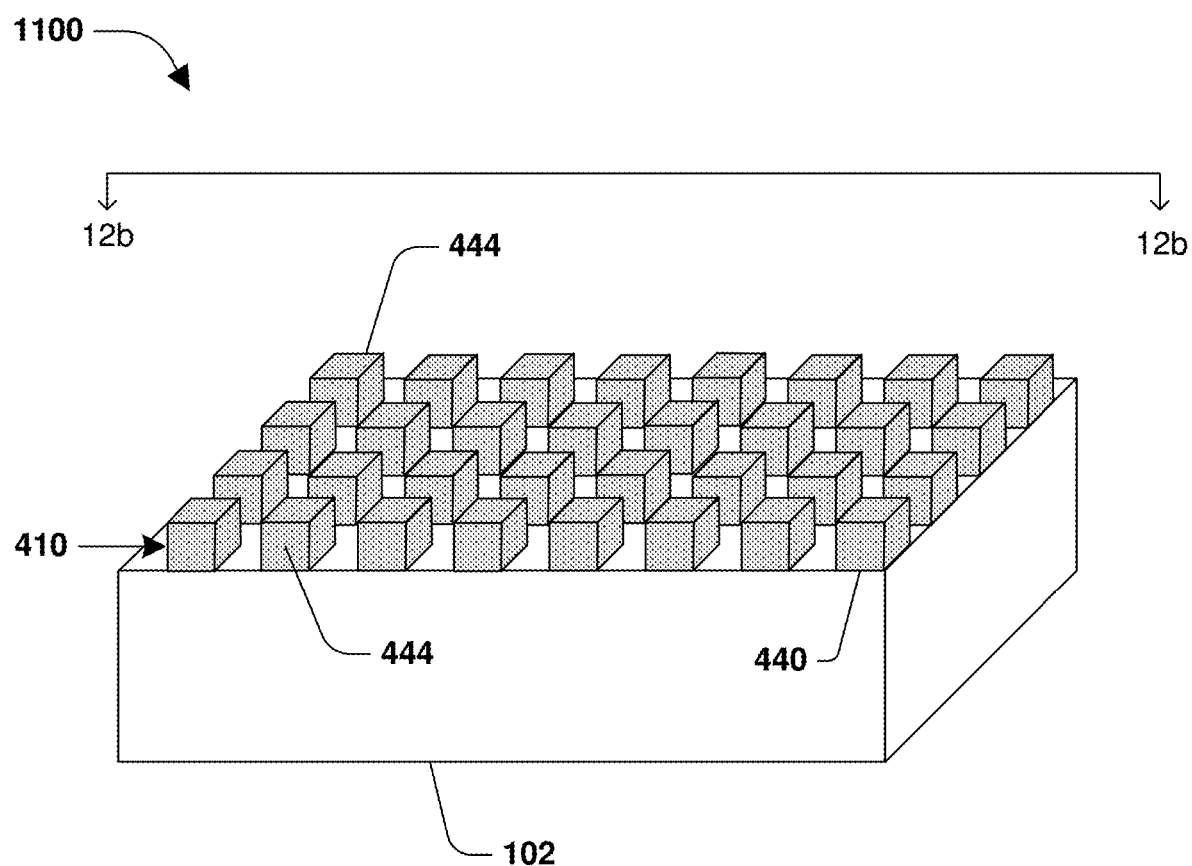
FIG. 12a illustrates a portion of a semiconductor arrangement, according to an embodiment.
Figure 12B:
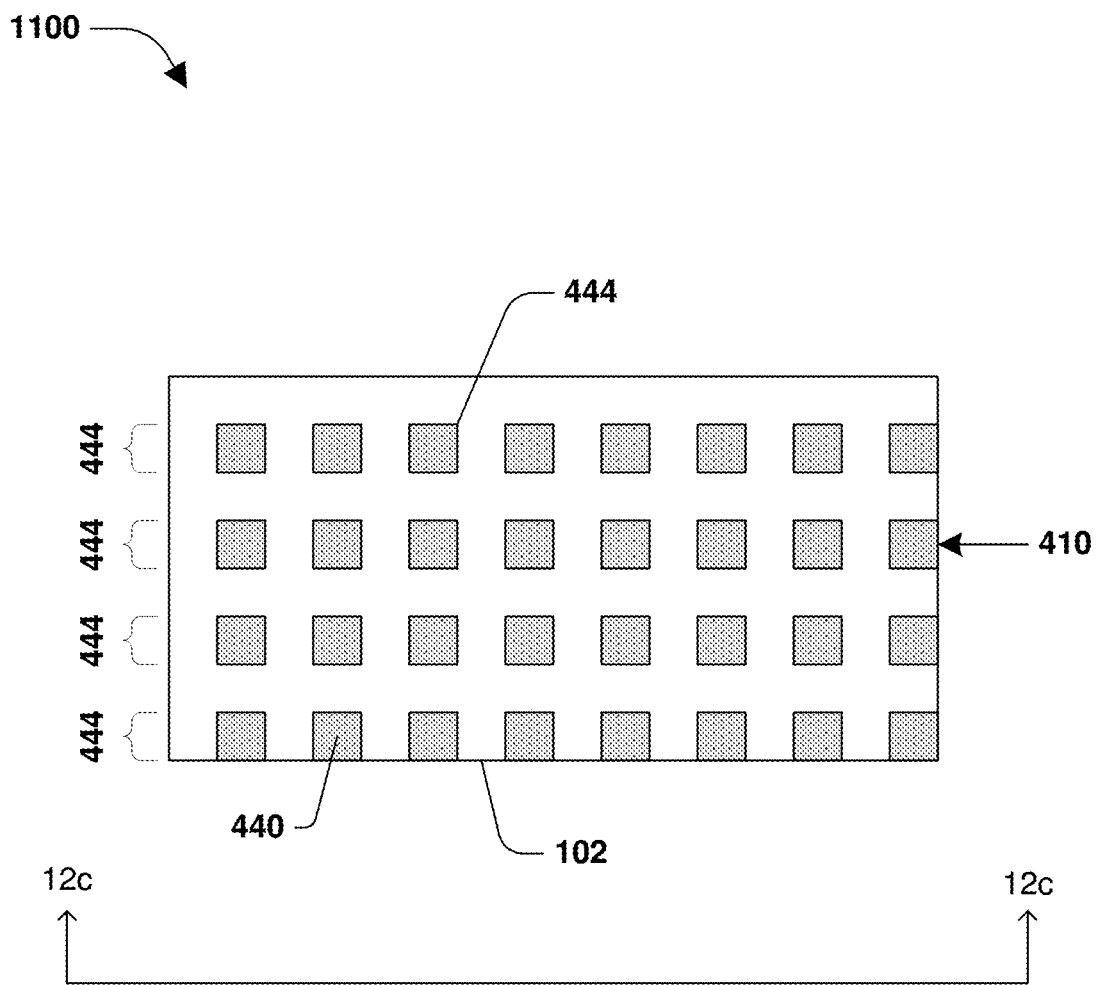
FIG. 12b illustrates a portion of a semiconductor arrangement, according to an embodiment.
Figure 12C:
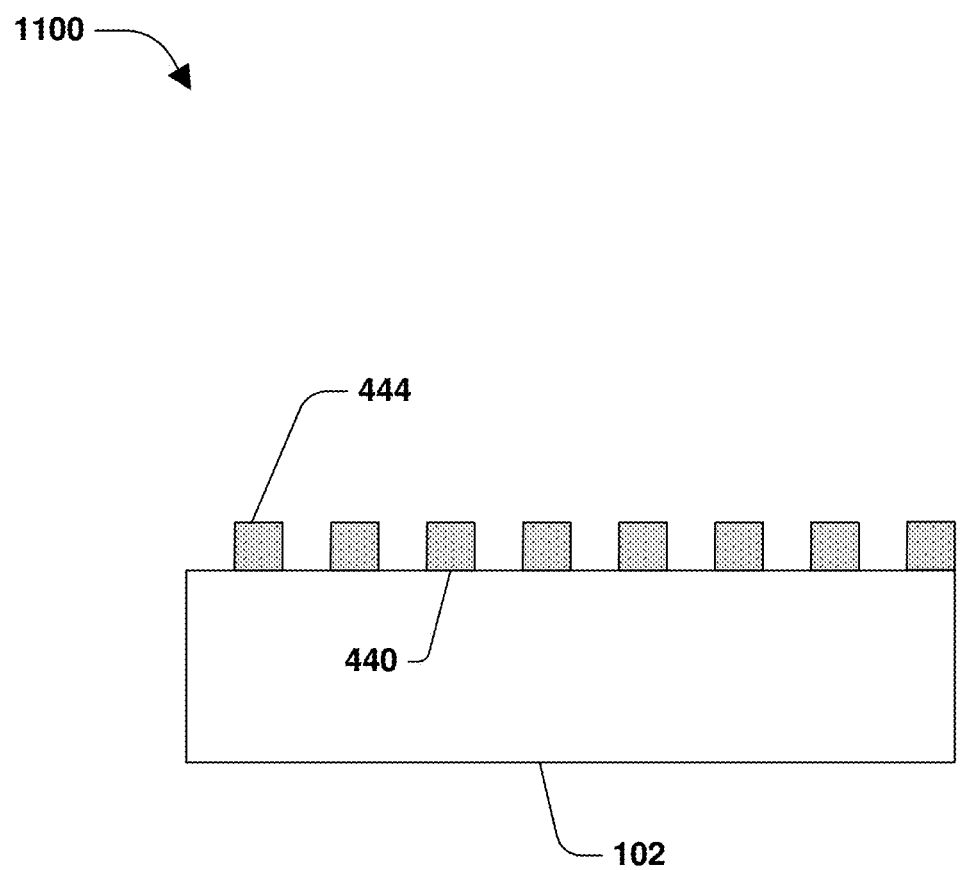
FIG. 12c illustrates a portion of a semiconductor arrangement, according to an embodiment.

Turning now to FIGS. 12a to 12c, in an embodiment, the second mask region 500 is patterned by removing the third mask portions 520 and the first mask region 410 is patterned by removing the first mask portions 420. FIG. 12b is a top down view of the embodiment of FIG. 12a as viewed from a perspective indicated by lines 12b-12b. FIG. 12c is a side elevation view of the embodiment of FIG. 12b as viewed from a perspective indicated by lines 12c-12c in FIG. 12b. In some embodiments, the third mask portions 520 and first mask portions 420 are removed by wet etching, dry etching, etc. According to some embodiments, the etch chemistry for etching through the third mask portions 520 and first mask portions 420 includes hydrofluoric acid, a fluorine-containing RIE plasma, etc. In some embodiments, the second areas 444 of the second mask portions 440 are not removed.

Figure 13:
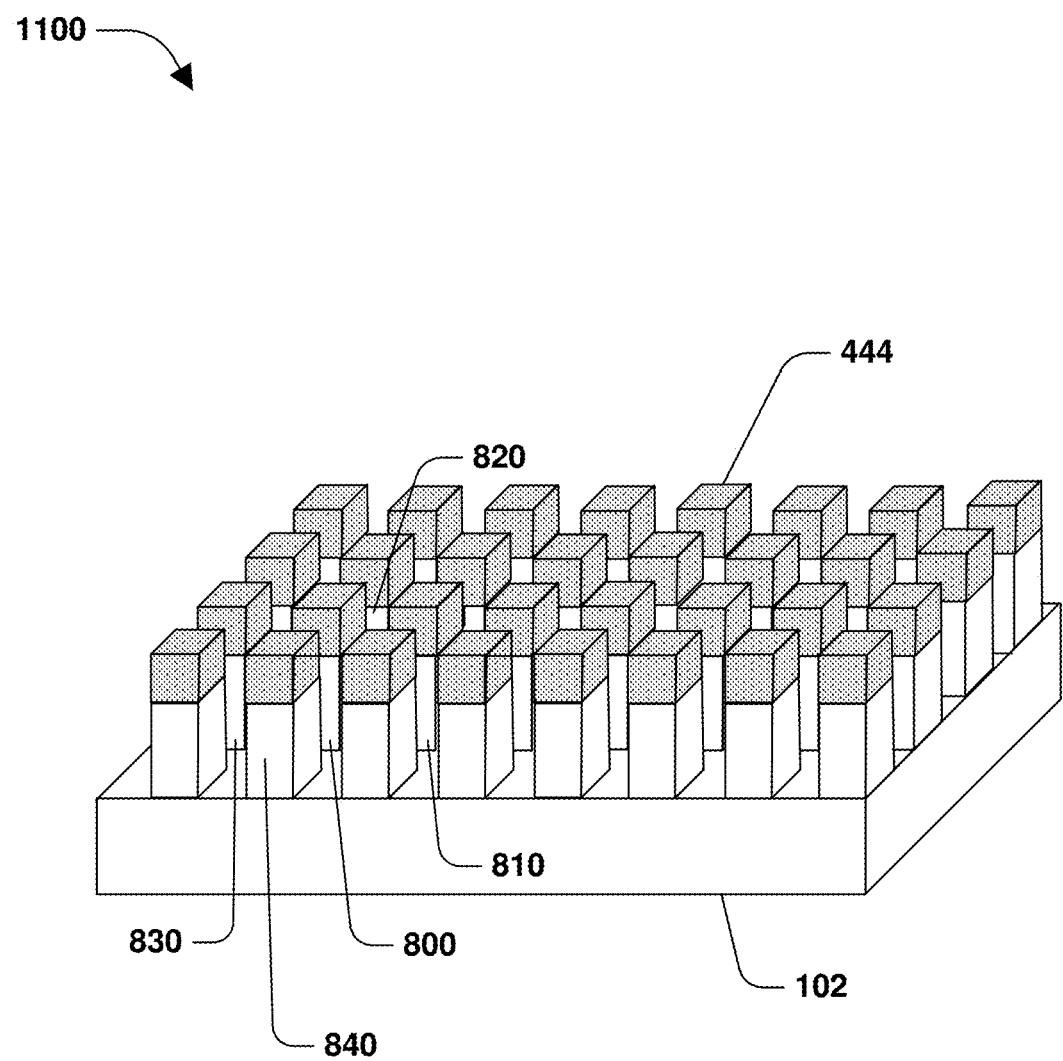
FIG. 13 illustrates forming a first semiconductor column and a second semiconductor column associated with forming a semiconductor arrangement, according to an embodiment.

Turning now to FIG. 13, in an embodiment, one or more semiconductor columns are formed. According to some embodiments, the first semiconductor column 800, second semiconductor column 810, third semiconductor column 820, fourth semiconductor column 830, and fifth semiconductor column 840 are formed under the second areas 444 of the second mask portions 440 under the third mask portions 520. In some embodiments, portions of the substrate region 102 that are not covered by the second areas 444 of the second mask portions 440 are removed to form the semiconductor columns 800, 810, 820, 830, 840.

Figure 14A:
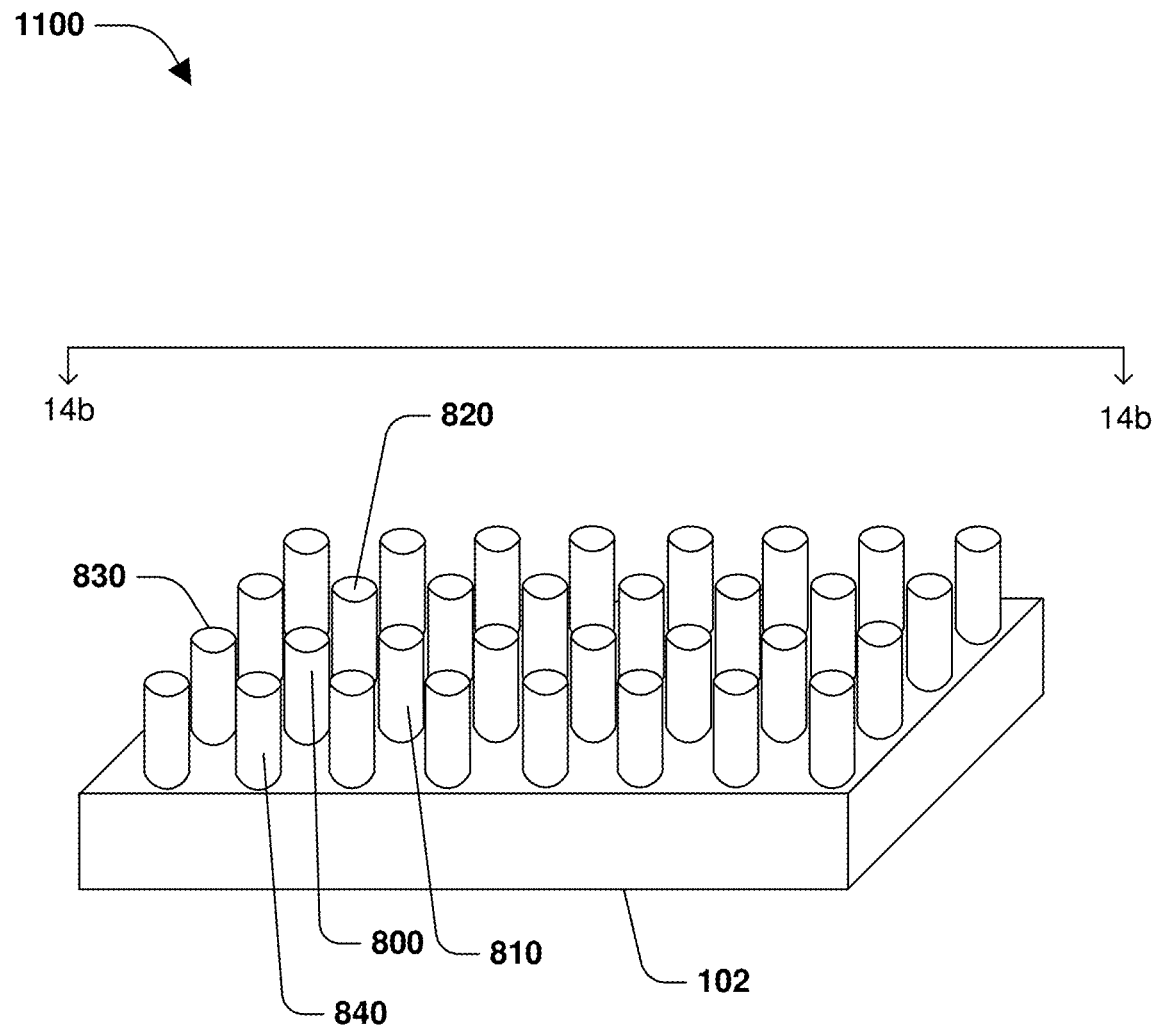
FIG. 14a illustrates forming a first semiconductor column and a second semiconductor column associated with forming a semiconductor arrangement, according to an embodiment.
Figure 14B:
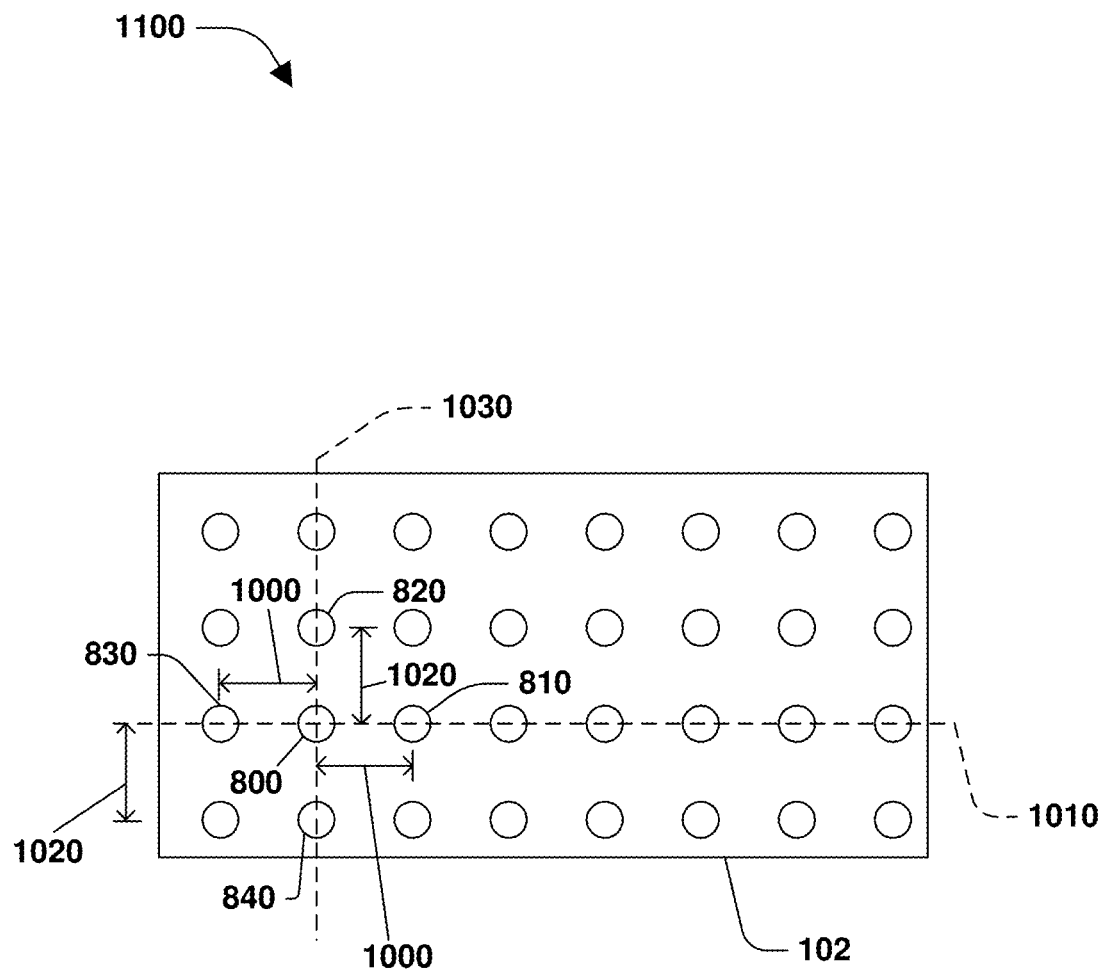
FIG. 14b illustrates forming a first semiconductor column and a second semiconductor column associated with forming a semiconductor arrangement, according to an embodiment.

Turning now to FIGS. 14a and 14b, according to some embodiments, the second areas 444 of the second mask portions 440 are removed and the semiconductor columns 800, 810, 820, 830, 840 are patterned. FIG. 14b is a top down view of the embodiment of FIG. 14a as viewed from a perspective indicated by lines 14b-14b. In an embodiment, the second areas 444 of the second mask portions 440 are removed in any number of ways, such as by etching. In some embodiments, the semiconductor columns 800, 810, 820, 830, 840 as well as zero or more other semiconductor columns not referenced, are patterned, such as by oxidization, annealing, such as in hydrogen ($H_2$), etc. In some embodiments, the semiconductor columns 800, 810, 820, 830, 840 are patterned before the second areas 444 of the second mask portions 440 are removed. In some embodiments, the semiconductor columns 800, 810, 820, 830, 840 are patterned after the second areas 444 of the second mask portions 440 are removed.

As illustrated in FIG. 14b, according to some embodiments, the second semiconductor column 810 is separated the first distance 1000 from the first semiconductor column 800. According to some embodiments, the second semiconductor column 810 is separated the first distance 1000 from the first semiconductor column 800 along the first axis 1010. According to some embodiments, the fourth semiconductor column 830 is separated the first distance 1000 from the first semiconductor column 800. In some embodiments, the fourth semiconductor column 830 is separated the first distance 1000 from the first semiconductor column 800 along the first axis 1010. According to some embodiments, the first distance 1000 separating the second semiconductor column 810 from the first semiconductor column 800 is different than the first distance 1000 separating the fourth semiconductor column 830 from the first semiconductor column 800.

According to some embodiments, the third semiconductor column 820 is separated the second distance 1020 from the first semiconductor column 800. According to some embodiments, the third semiconductor column 820 is separated the second distance 1020 from the first semiconductor column 800 along the second axis 1030. In some embodiments, the second axis 1030 is substantially perpendicular to the first axis 1010. According to some embodiments, the fifth semiconductor column 840 is separated the second distance 1020 from the first semiconductor column 800. In some embodiments, the fifth semiconductor column 840 is separated the second distance 1020 from the first semiconductor column 800 along the second axis 1030 that is substantially perpendicular to the first axis 1010. According to some embodiments, the second distance 1020 separating the third semiconductor column 820 from the first semiconductor column 800 is different than the second distance 1020 separating the fifth semiconductor column 840 from the first semiconductor column 800.

Figure 15:
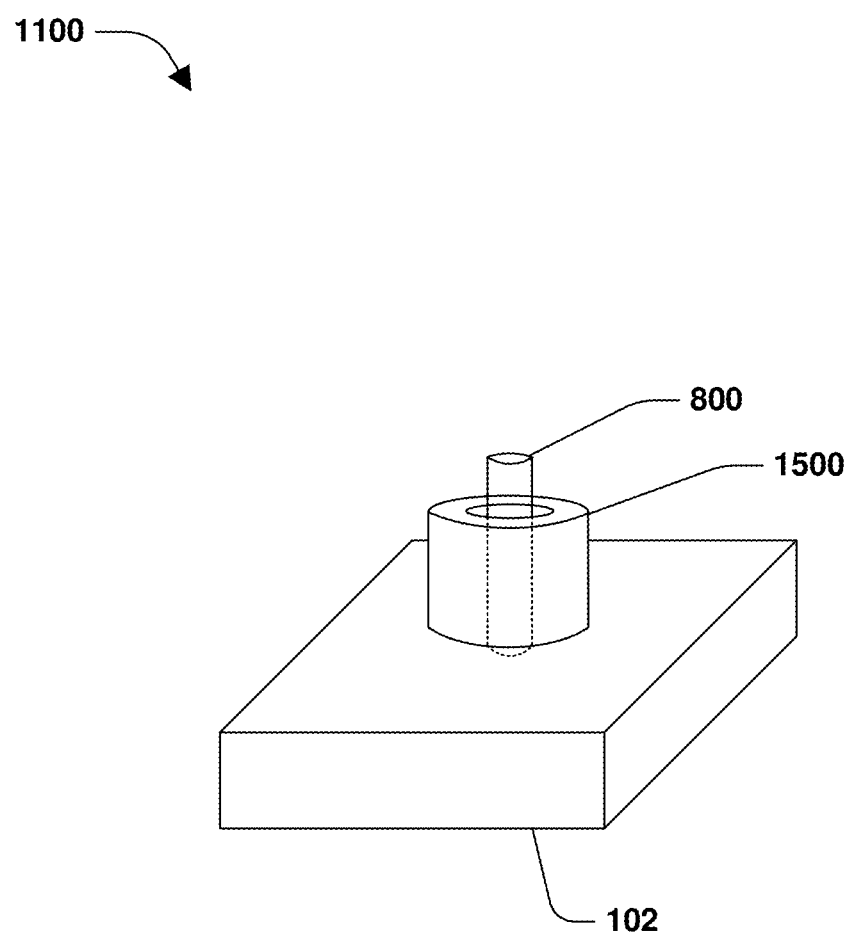
FIG. 15 illustrates a portion of a semiconductor arrangement, according to an embodiment.

Turning now to FIG. 15, in an embodiment, a gate electrode 1500 is formed around at least some of the semiconductor columns 800, 810, 820, 830, 840 as well as zero or more other semiconductor columns not referenced. In an embodiment, the gate electrode 1500 is formed around at least some of the first semiconductor column 800. According to some embodiments, the gate electrode 1500 wraps around the entire circumference or perimeter of the first semiconductor column 800, such that the semiconductor arrangement 100 comprises a vertical gate all around (VGAA) transistor. According to some embodiments, the gate electrode 1500 wraps around a portion of the circumference or perimeter of the first semiconductor column 800. In some embodiments, the first semiconductor column 800 functions as a channel.

Figure 16A:
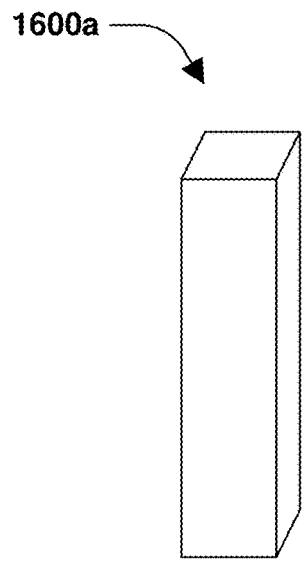
FIG. 16a illustrates a portion of a semiconductor arrangement, according to an embodiment.
Figure 16B:
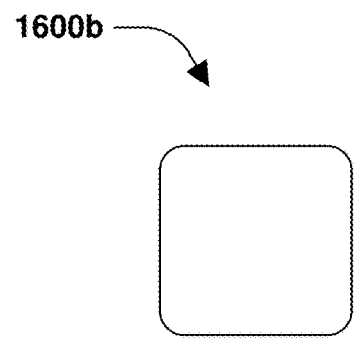
FIG. 16b illustrates a portion of a semiconductor arrangement, according to an embodiment.

Turning now to FIGS. 16a to 16d, in some embodiments, the semiconductor columns 800, 810, 820, 830, 840 are not limited to the cylindrical shape having a substantially circular cross-section illustrated in FIGS. 9, 10, 14a, 14b, and 15. As illustrated in FIG. 16a, according to some embodiments, some or all of the semiconductor columns 800, 810, 820, 830, 840, and zero or more columns not referenced, of the semiconductor arrangement 100, 1100 comprise a first semiconductor column 1600a. In an embodiment, the first semiconductor column 1600a comprises a substantially square or rectangular shape having a substantially quadrilateral cross-section. FIG. 16b illustrates a top down view of a first semiconductor column 1600b. According to some embodiments, some or all of the semiconductor columns of the semiconductor arrangement 100, 1100 comprise the first semiconductor column 1600b. In an embodiment, the first semiconductor column 1600b comprises a substantially square or rectangular shape with rounded corners.

Figure 16C:
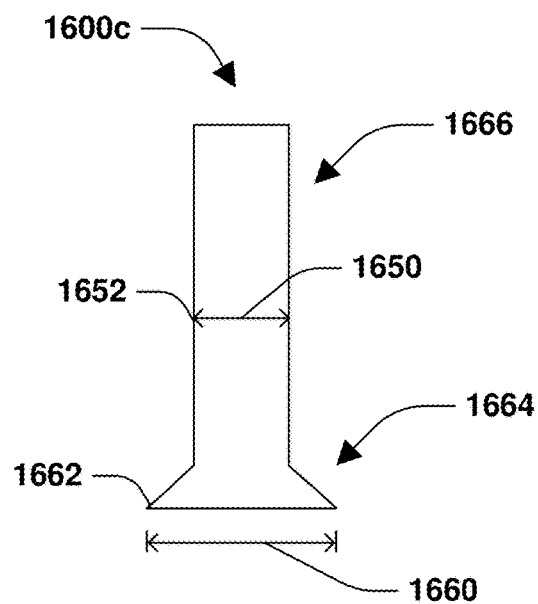
FIG. 16c illustrates a portion of a semiconductor arrangement, according to an embodiment.

As illustrated in FIG. 16c, according to some embodiments, some or all of the semiconductor columns 800, 810, 820, 830, 840 of the semiconductor arrangement 100, 1100 as well as zero or more other semiconductor columns not referenced, comprise a first semiconductor column 1600c. According to some embodiments, a first cross-sectional size 1650 at a first location 1652 along the first semiconductor column 1600c is less than a second cross-sectional size 1660 at a second location 1662 along the first semiconductor column 1600c. In an embodiment, an end 1664 of the first semiconductor column 1600c is larger than a center portion 1666 of the first semiconductor column 1600c. In some embodiments, the first semiconductor column 1600c comprises a substantially cylindrical shape, such that the first cross-sectional size 1650 and second cross-sectional size 1660 comprise a diameter. In some embodiments, the first semiconductor column 1600c comprises a substantially square or rectangular shape.

Figure 16D:
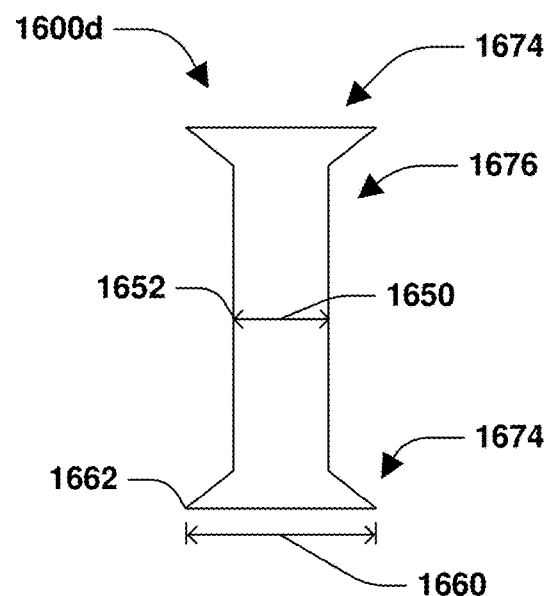
FIG. 16d illustrates a portion of a semiconductor arrangement, according to an embodiment.

As illustrated in FIG. 16d, according to some embodiments, some or all of the semiconductor columns 800, 810, 820, 830, 840 of the semiconductor arrangement 100, 1100 as well as zero or more other semiconductor columns not referenced, comprise a first semiconductor column 1600d. According to some embodiments, the first cross-sectional size 1650 at the first location 1652 along the first semiconductor column 1600c is less than the second cross-sectional size 1660 at the second location 1662 along the first semiconductor column 1600d. In an embodiment, ends 1674 of the first semiconductor column 1600d are larger than a center portion 1676 of the first semiconductor column 1600d. In some embodiments, the first semiconductor column 1600d comprises a substantially cylindrical shape, such that the first cross-sectional size 1650 and second cross-sectional size 1660 comprise a diameter. In some embodiments, the first semiconductor column 1600d comprises a substantially square or rectangular shape.

Figure 17:
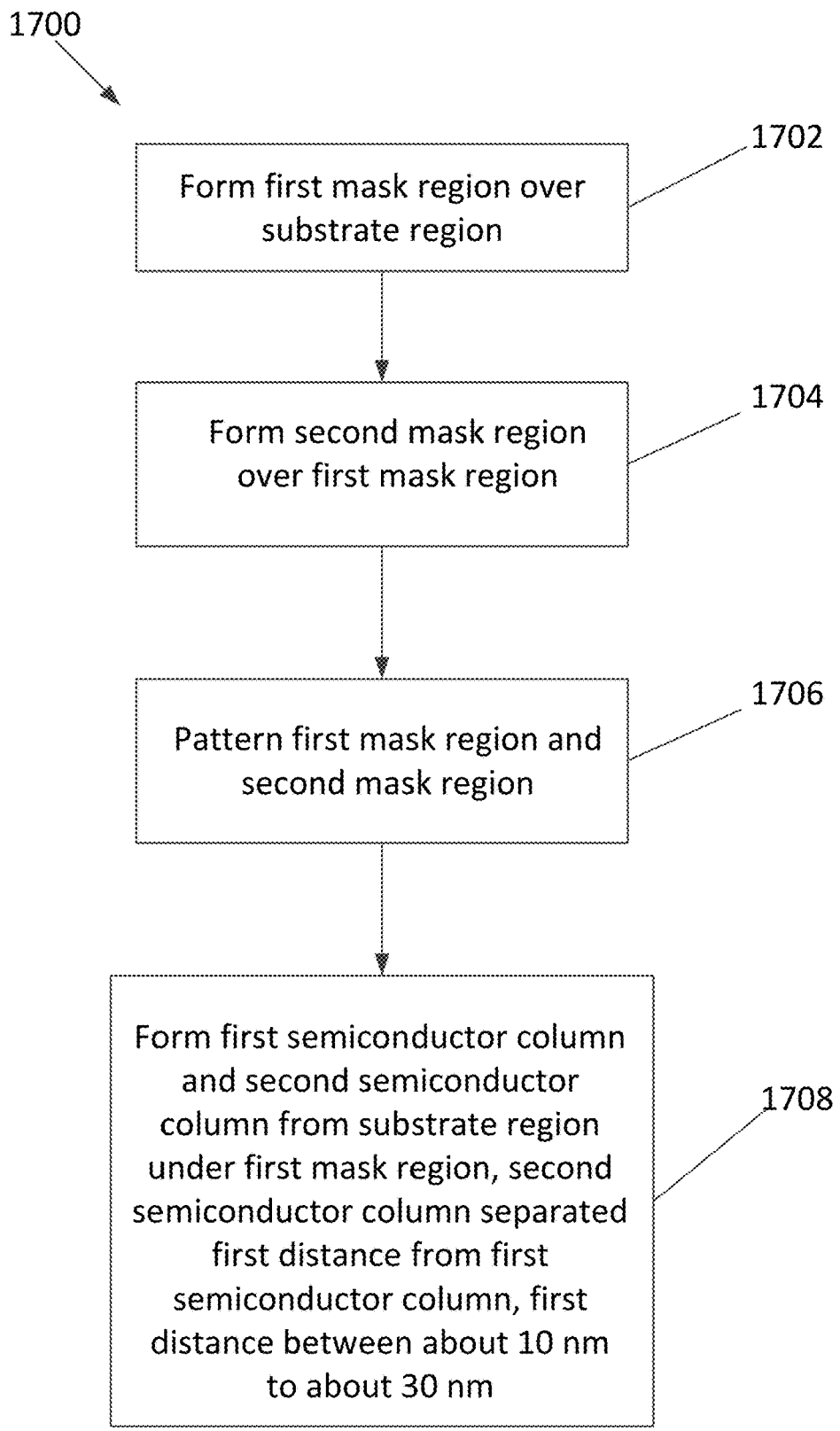
FIG. 17 illustrates a method of forming a semiconductor arrangement, according to an embodiment.

An example method 1700 of forming a semiconductor arrangement, such as semiconductor arrangement 100, according to some embodiments, is illustrated in FIG. 17. At 1702, the first mask region 410 is formed over the substrate region 102. At 1704, the second mask region 500 is formed over the first mask region 410. At 1706, the first mask region 410 and the second mask region 500 are patterned. At 1708, the first semiconductor column 800 and the second semiconductor column 810 are formed from the substrate region 102 under the first mask region 410, the second semiconductor column 810 separated the first distance 1000 from the first semiconductor column 800, the first distance 1000 between about 10 nm to about 30 nm.

In an embodiment, a semiconductor arrangement comprises a substrate region and a first semiconductor column projecting from the substrate region. In an embodiment, the semiconductor arrangement comprises a second semiconductor column projecting from the substrate region. In an embodiment, the second semiconductor column is separated a first distance from the first semiconductor column. In an embodiment, the first distance is between about 10 nm to about 30 nm.

In an embodiment, a semiconductor arrangement comprises a substrate region and a first semiconductor column projecting from the substrate region. In an embodiment, the semiconductor arrangement comprises a second semiconductor column projecting from the substrate region. In an embodiment, the second semiconductor column is separated a first distance from the first semiconductor column along a first axis. In an embodiment, the first distance is between about 10 nm to about 30 nm. In an embodiment, the semiconductor arrangement comprises a third semiconductor column projecting from the substrate region. In an embodiment, the third semiconductor column is separated a second distance from the first semiconductor column along a second axis that is substantially perpendicular to the first axis. In an embodiment, the second distance is between about 10 nm to about 30 nm.

In an embodiment, a method of forming a semiconductor arrangement comprises forming a first mask region over a substrate region. In an embodiment, the method comprises forming a second mask region over the first mask region. In an embodiment, the method comprises patterning the first mask region and the second mask region. In an embodiment, the method comprises forming a first semiconductor column and a second semiconductor column from the substrate region under the first mask region. In an embodiment, the second semiconductor column is separated a first distance from the first semiconductor column. In an embodiment, the first distance is between about 10 nm to about 30 nm Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD) or plasma-enhanced chemical vapor deposition (PECVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first area and a second area generally correspond to area A and area B or two different or two identical areas or the same area.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:
   forming a first mask structure and a second mask structure over a substrate, wherein:
      the first mask structure and the second mask structure extend in a first direction, and
      the first mask structure and the second mask structure are made of a first mask material;
   forming a third mask structure and a fourth mask structure over the substrate and between the first mask structure and the second mask structure, wherein:
      the third mask structure and the fourth mask structure extend in the first direction, and
      the third mask structure and the fourth mask structure are made of a second mask material;
   forming a fifth mask structure over the substrate and between the third mask structure and the fourth mask structure, wherein:
      the forming a fifth mask structure occurs after the forming a third mask structure and after the forming a fourth mask structure,
      the fifth mask structure extends in the first direction, and
      the fifth mask structure is made of a material different than the second mask material;
   forming a sixth mask structure over the first mask structure, the second mask structure, the third mask structure, the fourth mask structure, and the fifth mask structure, wherein the sixth mask structure extends in a second direction; and
   removing a portion of at least one of the first mask structure or the fifth mask structure not concealed by the sixth mask structure.

2. The method of claim 1, wherein the sixth mask structure is made of a material different than the first mask material.

3. The method of claim 1, wherein the sixth mask structure is made of the second mask material.

4. The method of claim 1, wherein the sixth mask structure protects a second portion of the at least one of the first mask structure or the fifth mask structure concealed by the sixth mask structure during the removing a portion of at least one of the first mask structure or the fifth mask structure not concealed by the sixth mask structure.

5. The method of claim 1, wherein the forming a third mask structure and a fourth mask structure comprises forming the third mask structure and the fourth mask structure concurrently.

6. The method of claim 1, wherein the fifth mask structure is made of the first mask material.

7. The method of claim 1, wherein the removing a portion of at least one of the first mask structure or the fifth mask structure not concealed by the sixth mask structure comprises:
   concurrently removing a portion of the first mask structure not concealed by the sixth mask structure and a portion of the fifth mask structure not concealed by the sixth mask structure.

8. The method of claim 1, comprising:
   removing the third mask structure, the fourth mask structure, and the sixth mask structure to expose a second portion of the at least one of the first mask structure or the fifth mask structure.

9. The method of claim 8, comprising etching the substrate, wherein, after the etching, a first semiconductor column is defined by a portion of the substrate underlying the second portion of the at least one of the first mask structure or the fifth mask structure.

10. The method of claim 1, comprising removing a portion of the second mask structure not concealed by the sixth mask structure concurrently with the removing a portion of at least one of the first mask structure or the fifth mask structure.

11. The method of claim 10, wherein the removing a portion of at least one of the first mask structure or the fifth mask structure not concealed by the sixth mask structure comprises:
   concurrently removing a portion of the first mask structure not concealed by the sixth mask structure and a portion of the fifth mask structure not concealed by the sixth mask structure.

12. The method of claim 1, wherein the forming a first mask structure and a second mask structure comprises:
   using a lithography tool having a resolution limit to form the first mask structure and the second mask structure over the substrate, wherein the first mask structure and the second mask structure are separated by a first pitch greater than or equal to the resolution limit.

13. A method of forming a semiconductor arrangement, comprising:
   forming a first set of mask structures over a substrate, wherein the first set of mask structures extend in a first direction and are made of a first mask material;
   forming a second set of mask structures over the substrate, wherein:
      the forming a first set of mask structures comprises:
         forming a first subset of the first set of mask structures before the forming a second set of mask structures; and
         forming a second subset of the first set of mask structures after the forming a second set of mask structures, and
      the second set of mask structures extend in the first direction and are made of a second mask material;
   forming a third set of mask structures over the first set of mask structures and over the second set of mask structures, wherein the third set of mask structures extend in a second direction and are made of a material different than the first mask material;
   removing first portions of the first set of mask structures that are not concealed by at least one mask structure of the third set of mask structures, wherein second portions of the first set of mask structures that are concealed by at least one mask structure of the third set of mask structures remain after the removing first portions of the first set of mask structures;
   removing the third set of mask structures and the second set of mask structures after the removing first portions of the first set of mask structures; and
   etching the substrate to define semiconductor columns underlying the second portions of the first set of mask structures.

14. The method of claim 13, wherein the first set of mask structures and the second set of mask structures are formed in an alternating pattern.

15. The method of claim 13, comprising forming a gate electrode around a perimeter of each of the semiconductor columns.

16. The method of claim 13, wherein:
the first mask material comprises an oxide or a nitride,
the second mask material comprises the nitride when the first mask material comprises the oxide, and
the second mask material comprises the oxide when the first mask material comprises the nitride.

17. A method of forming a semiconductor arrangement, comprising:
using a lithography tool having a resolution limit and forming a first mask structure and a second mask structure over a substrate, wherein the first mask structure and the second mask structure extend in a first direction and are separated by a first pitch greater than or equal to the resolution limit;
forming a third mask structure and a fourth mask structure over the substrate and between the first mask structure and the second mask structure, wherein:
the third mask structure and the fourth mask structure extend in the first direction,
the third mask structure interfaces with the first mask structure, and
the fourth mask structure interfaces with the second mask structure;
forming a fifth mask structure over the substrate and between the third mask structure and the fourth mask structure, the fifth mask structure interfacing with the third mask structure and the fourth mask structure;
forming a sixth mask structure over the first mask structure, the second mask structure, the third mask structure, the fourth mask structure, and the fifth mask structure, wherein the sixth mask structure extends in a second direction;
removing a portion of at least one of the first mask structure or the fifth mask structure not concealed by the sixth mask structure; and
using a second portion of the at least one of the first mask structure or the fifth mask structure to form semiconductor columns from the substrate, wherein a pitch between a first semiconductor column of the semiconductor columns and a second semiconductor column of the semiconductor columns is less than the resolution limit of the lithography tool.

18. The method of claim 17, wherein the removing a portion of at least one of the first mask structure or the fifth mask structure not concealed by the sixth mask structure comprises:
concurrently removing a portion of the first mask structure not concealed by the sixth mask structure and a portion of the fifth mask structure not concealed by the sixth mask structure.

19. The method of claim 17, comprising:
removing the third mask structure, the fourth mask structure, and the sixth mask structure to expose a sidewall and a top surface of the second portion of the at least one of the first mask structure or the fifth mask structure.

20. The method of claim 17, wherein:
the first mask structure and the second mask structure are made of a first mask material, and
the third mask structure and the fourth mask structure are made of a second mask material different than the first mask material.

* * * * *